US006833854B1

United States Patent
Sandström

(10) Patent No.: US 6,833,854 B1
(45) Date of Patent: Dec. 21, 2004

(54) METHOD FOR HIGH PRECISION PRINTING OF PATTERNS

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 10/460,765

(22) Filed: Jun. 12, 2003

(51) Int. Cl.[7] .......................... B41M 7/00; B01J 19/08
(52) U.S. Cl. ...................... 347/239; 347/255; 359/298; 359/308; 359/459; 250/461.1; 250/504 R; 250/365
(58) Field of Search ................................ 359/298, 308, 359/459; 347/239, 255; 250/461.1, 504 R, 365

(56) References Cited

U.S. PATENT DOCUMENTS

| 5,148,157 A | 9/1992 | Florence |
| 5,467,146 A | 11/1995 | Huang et al. |
| 5,581,292 A * | 12/1996 | Cianciosi et al. ........... 347/131 |
| 5,835,256 A | 11/1998 | Huibers |
| 6,088,102 A | 7/2000 | Manhart |
| 6,142,641 A | 11/2000 | Cohen et al. |
| 6,285,488 B1 | 9/2001 | Sandstrom |
| 6,504,644 B1 | 1/2003 | Sandstrom |
| 6,717,097 B1 * | 4/2004 | Sandstrom et al. ...... 219/121.6 |
| 2002/0176151 A1 * | 11/2002 | Moon et al. ................. 359/298 |

FOREIGN PATENT DOCUMENTS

WO    WO 01/18606 A1    3/2001

* cited by examiner

*Primary Examiner*—Nikita Wells
(74) *Attorney, Agent, or Firm*—Ernest J. Beffel, Jr.; Haynes Beffel & Wolfeld LLP

(57) ABSTRACT

An aspect of the present invention includes a method to print pattern with improved edge acuity. In one embodiment a method for printing fine patterns comprising the actions of: providing an SLM and providing a pixel layout pattern with different categories of modulating elements, the categories differing in the phase of the complex amplitude. Other aspects of the present invention are reflected in the detailed description, figures and claims.

42 Claims, 33 Drawing Sheets

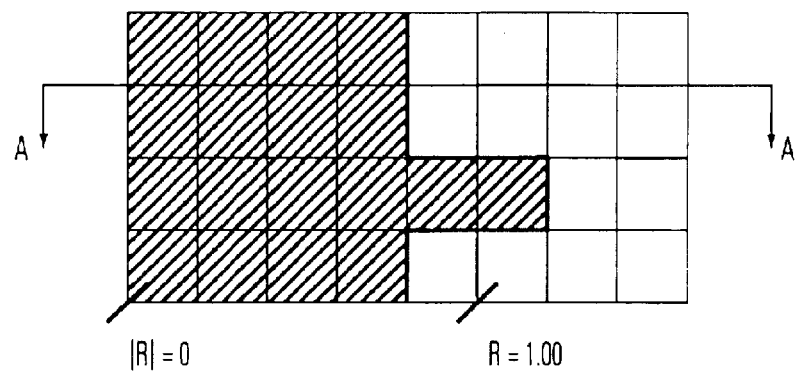
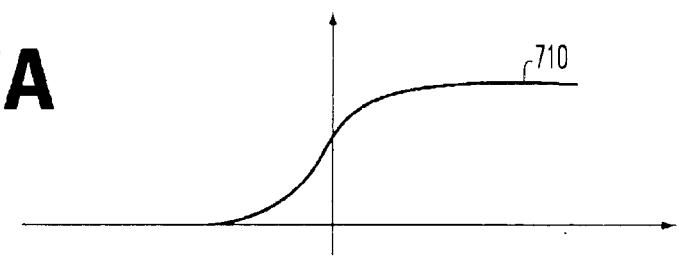
FIG. 7A
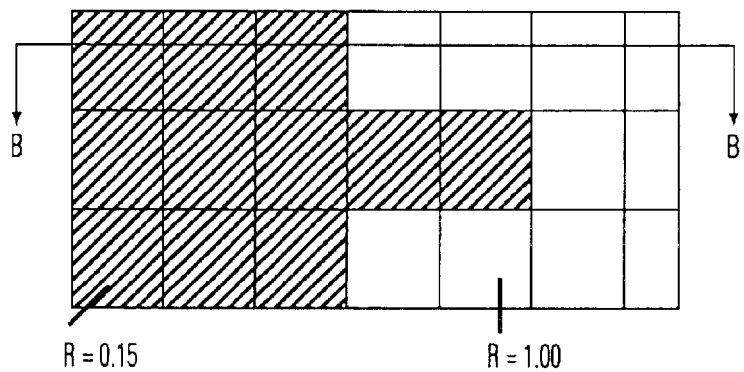
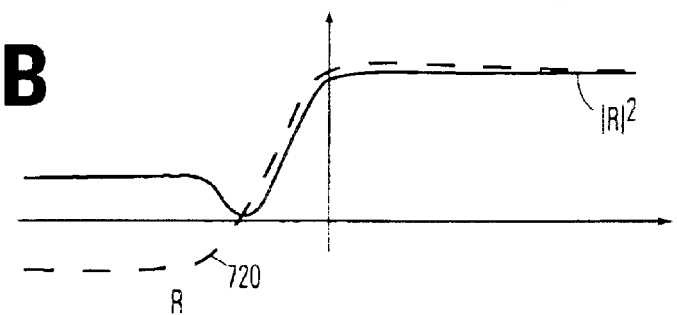
FIG. 7B

FIG. 9A
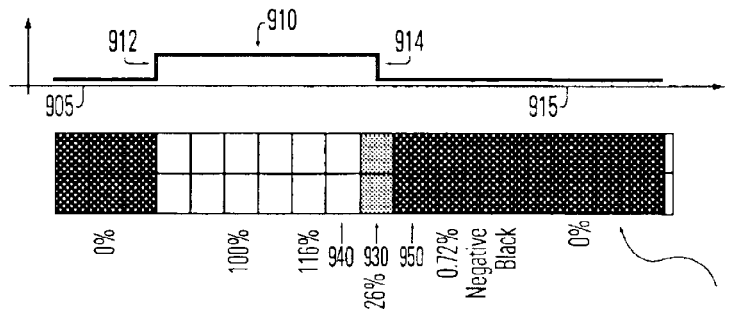
FIG. 9B
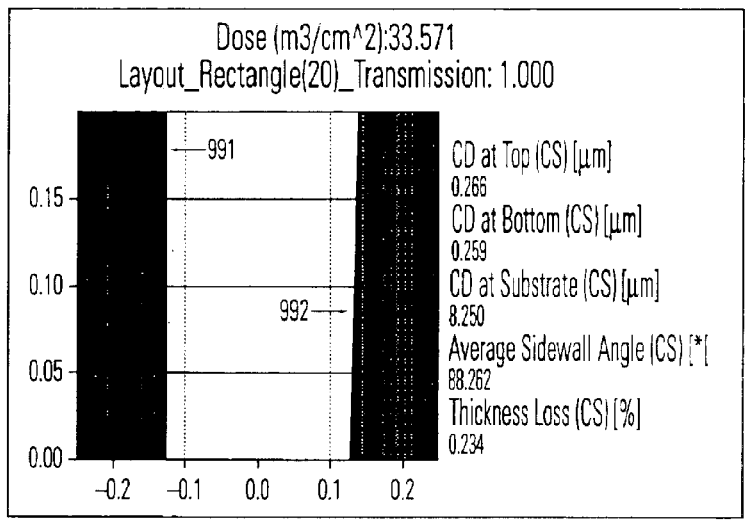
FIG. 9C
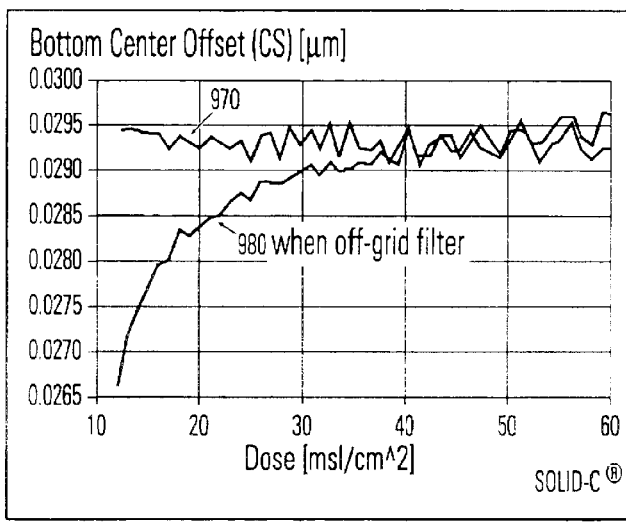
FIG. 9D

FIG. 14B   FIG. 14C

An Off-Grid Filter Implementation

| B1 | B2 | B3 | B4 | B5 |
|----|----|----|----|----|
| B6 | B7 | B8 | B9 | B10 |
| B11 | B12 | B13 | B14 | B15 |
| B16 | B17 | B18 | B19 | B20 |
| B21 | B22 | B23 | B24 | B25 |

| K7 | K8 | K9 |
|----|----|----|
| K12 | K13 | K14 |
| K17 | K18 | K19 |

- B is the bitmap from the rasteriser with values in the range 0 – 1
- K is a coefficient array or kernel 3 x 3, 5 x 5 pixels or larger
- W is a weighting bitmap used to weight the contribution to each entry in the bitmap B
  - $Wn = 4*(1-Bn)*Bn + \max(4*(1-Bneighbors)*Bneighbours)$
- An adjusted value of B13 is computed as
  - $B13_{filtered} = B13 + W13*(F7*B7 + ... + K19*B19)$
  - $W13 = 4*(1-B13)*B13 + \max(4*(1-B7)*B7, ..., 4*(1-B12)*B12, 4*(1-B14)*B14, ..., 4*(1-B19)*B19)$
- The same or similar functions can be implemented in other ways, this is just a very regular way to express it.

Example kernel

| -0.1 | -0.2 | -0.1 |
|------|------|------|
| -0.2 | 0 | -0.2 |
| -0.1 | -0.2 | -0.1 |

FIG. 24A

An Off-Grid Filter

| B1 | B2 | B3 | B4 | B5 |
|---|---|---|---|---|
| B6 | B7 | B8 | B9 | B10 |
| B11 | B12 | B13 | B14 | B15 |
| B16 | B17 | B18 | B19 | B20 |
| B21 | B22 | B23 | B24 | B25 |

| F1 | F2 | F3 | F4 | F5 |
|---|---|---|---|---|
| F6 | F7 | F8 | F9 | F10 |
| F11 | F12 | F13 | F14 | F15 |
| F16 | F17 | F18 | F19 | F20 |
| F21 | F22 | F23 | F24 | F25 |

| G1 | G2 | G3 | G4 | G5 |
|---|---|---|---|---|
| G6 | G7 | G8 | G9 | G10 |
| G11 | G12 | G13 | G14 | G15 |
| G16 | G17 | G18 | G19 | G20 |
| G21 | G22 | G23 | G24 | G25 |

- B is the bitmap from the rasteriser with values in the range 0 – 1, G and F derived bitmaps used for the filter
  - $G_n = 2(B_n - 0.5)$
  - $F_n = 4(B_n - 1)(B_n - 0)$
- K is a coefficient array or kernel 3 x 3, 5 x 5 pixels or larger
- An adjusted value of B13 is computed as
  - $B13_{filtered} = B13 + K7*G7*F7*B7 + \ldots + K19*G19*F19*B19$
- The same or similar functions can be implemented in other ways, this is just a very regular way to express it.

| K7 | K8 | K9 |
|---|---|---|
| K12 | K13 | K14 |
| K17 | K18 | K19 |

Example kernel

| -0.1 | -0.2 | -0.1 |
|---|---|---|
| -0.2 | 0 | -0.2 |
| -0.1 | -0.2 | -0.1 |

FIG. 24B

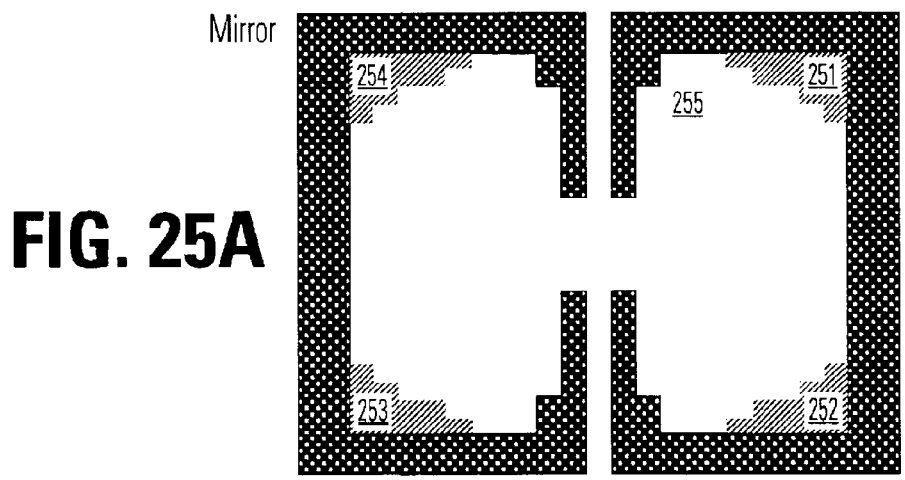
FIG. 25A
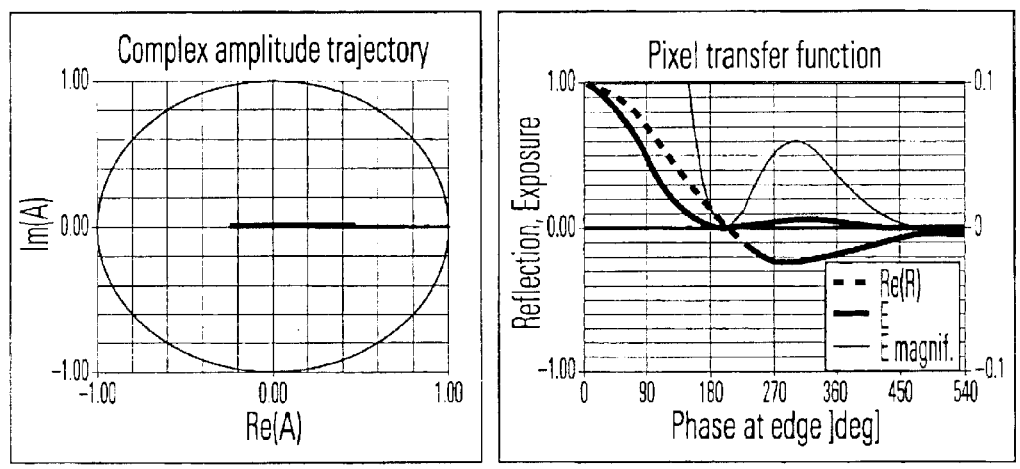
FIG. 25B     FIG. 25C

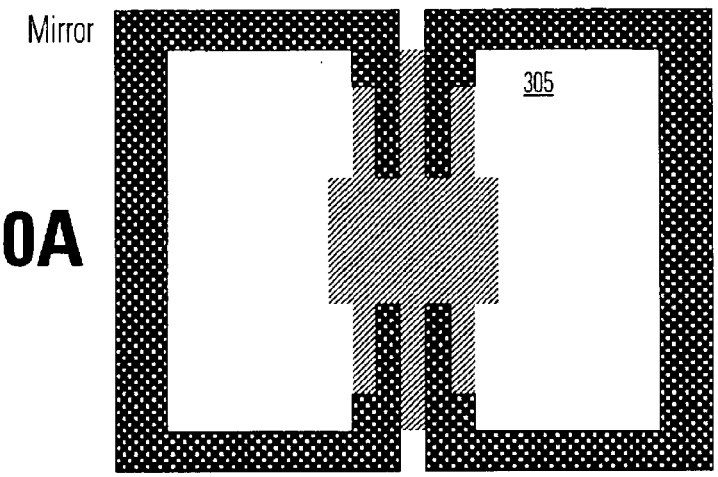
FIG. 30A
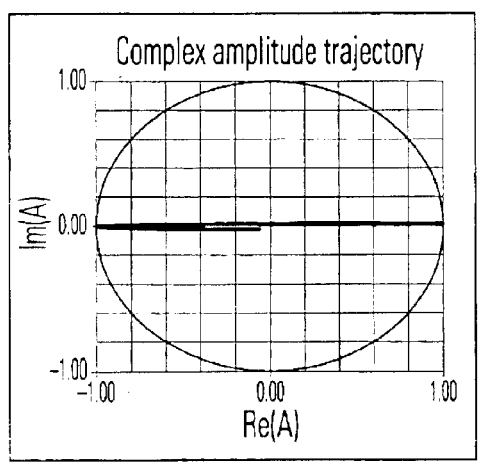
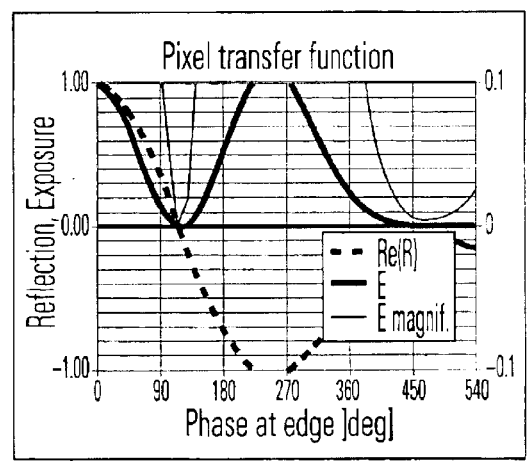
FIG. 30B     FIG. 30C

Cut A:
on-grid

Cut B:
on-grid

METHOD FOR HIGH PRECISION PRINTING OF PATTERNS

RELATED APPLICATION

This application is related to the U.S. patent application Ser. No. 10/462,010, filed Jun. 12, 2003, entitled "Methods and Systems for Improved Boundary Contrast" by inventor Torbjörn Sandström, which is hereby incorporated by reference.

FIELD OF THE INVENTION

The invention relates to the printing of patterns with high precision, in particular to printing of microlithographic pattern such as patterns on photomasks and wafers. The invention may also be applied to other printing, such as for the formation of optical devices, electronic interconnects and even to decorative printing and security printing.

The invention is particularly suited to but not limited to optical printing using partially coherent light, such as from excimer and atomic lasers and from EUV light sources. In a preferred embodiment it is applied to a maskless scanner for exposure of patterns onto semiconductor wafers without the need for reticles or masks.

BACKGROUND OF THE INVENTION

In the past, integrated circuits have been manufactured more or less solely by using a number of masks or reticles comprising a pattern of a layer in said integrated circuit. In today's integrated circuits the number of layers could be larger than 30. Said Masks or reticles may be prepared in lithographical manner by using for example electron beams or laser beams for exposing a layer of material sensitive for the type of beam chosen. The mask material is most commonly transmissive on top of one of its sides a thin layer of opaque material is attached. In said thin material the pattern of one layer of said integrated circuit is created. The mask has typically N times larger pattern than the pattern to be printed on the semiconducting substrate for forming said integrated circuit. The reduction in size is performed in a stepper, which uses the mask(s) for forming said integrated circuit.

More recently, the need to manufacture integrated circuits by means other than using a conventional mask has developed for a number of reasons, for example the price of manufacturing mask(s) has increased due to its complexity to manufacture, small-scale development which needs very small series of integrated circuits, etc.

Unfortunately, all of the present known techniques for forming integrated circuits without using conventional masks or reticles have drawbacks and limitations.

For example, most direct-writers known in the art are based on electron beams, typically so called shaped beams, where, the pattern is assembled from flashes, each defining a simple geometrical figure. Other systems are known which use raster scanning of Gaussian beams. By using a conventional mask writer, which uses beams of electrons or laser beams for forming the pattern on a workpiece, is limited to relatively low scanning speeds, and, perhaps worst of all, can only scan a single dimension.

SLM writers disclosed in other patent applications, such as WO 01/18606 and U.S. patent application Ser. No. 09/954,721 by the same assignees as the present invention and hereby incorporated by reference is related to raster scanning in the sense that it permits a bitmap pattern, but distinct by printing an entire frame of pattern in one flash instead of building the pattern from individual pixels.

A spatial light modulator (SLM) comprises a number of modulator elements, which can be set in a desired way for forming a desired pattern. Reflective SLMs may be exposed to any kind of electromagnetic radiation, for example DUV or EUV for forming the desired pattern on the mask.

The same assignee has in a number of previous patent applications, for instance WO 99/45440 and WO 99/45441, disclosed pattern generator technology for precision printing of submicron patterns. Typically the embodiments taught in said applications use SLMs with analog modulation. The modulating elements are micromechanical mirrors that are capable of gradually move from a resting to a fully actuated state in response to an electronic drive signal, and the elements form one or two-dimensional arrays of modulating elements. A pattern defined in an input database is rasterized to a bitmap were each pixel can have several states between a lightest and a darkest state.

What is needed is a method and apparatus, which creates pattern on a workpiece using a programmable reticle or mask, such as a spatial light modulator, capable to create patterns with high feature edge acuity. What is also needed is a method and apparatus capable to pattern feature boundaries with high accuracy of placement.

SUMMARY OF THE INVENTION

Accordingly, it is an object of the present invention to provide a method of patterning a workpiece, which overcomes or at least reduces the above-mentioned problem of creating fine patterns with huh acuity and high accuracy of placement of feature boundaries.

This object, among others, is according to a first aspect of the invention attained by a method for printing fine patterns with high precision Said method comprising the actions of providing an SLM having an array of modulator elements, providing an electromagnetic radiation source, collimating radiation from said radiation source to create partially coherent illumination of said SLM with a coherence length that is larger than half the pitch of the modulating elements in the SLM, creating a negative complex amplitude with at least one modulator element.

Other aspects of the present invention are reflected in the detailed description, figures and claims.

BRIEF DESCRIPTION OF THE DRAWINGS

FIG. 7a illustrates a prior art method of patterning a substrate only using positive complex amplitude.

FIG. 7b illustrates in inventive method of patterning a substrate using positive and negative complex amplitudes.

FIG. 9a depicts a clear feature in vector data.

FIG. 9b depicts a rasterized representation of the vector data in FIG. 9a with the off grid edge enhanced by extra exposure on the new bright pixel and negative black on the dark pixel.

FIG. 9c depicts a screen shot of resist edges from a Solid-C simulator.

FIG. 9d depicts a screen shot showing the position of the center of the clear feature vs. dose with and without enhancement of the off-grid edge.

FIG. 10a depicts an alternating phase shift mask.

FIG. 10b depicts SLM pixels with complex amplitude reflectivity corresponding to the alternating phase shift mask in FIG. 10a.

FIG. 14b depicts the complex amplitude trajectory of the mirror in FIG. 14a.

FIG. 14c depicts a pixel transfer function of the mirror in FIG. 14a.

FIG. 15b depicts the complex amplitude trajectory of the mirror in FIG. 15a.

FIG. 15c depicts a pixel transfer function of the mirror in FIG. 15a.

FIG. 16b depicts the complex amplitude trajectory of the mirror in FIG. 16a.

FIG. 16 depicts a pixel transfer function of the mirror in FIG. 16a.

FIG. 17b depicts the complex amplitude trajectory of the mirror in FIG. 17a.

FIG. 17c depicts a pixel transfer function of the mirror in FIG. 17a.

FIG. 18b depicts the complex amplitude trajectory of the mirror in FIG. 18a.

FIG. 18c depicts a pixel transfer function of the mirror in FIG. 18a.

FIG. 19b depicts the complex amplitude trajectory of the mirror in FIG. 19a.

FIG. 19c depicts a pixel transfer function of the mirror in FIG. 19a.

FIG. 20b depicts the complex amplitude trajectory of the mirror in FIG. 20a.

FIG. 20c depicts a pixel transfer function of the mirror in FIG. 20a.

FIG. 21b depicts the complex amplitude trajectory of the mirror in FIG. 21a.

FIG. 21c depicts a pixel transfer function of the mirror in FIG. 21a.

FIG. 22b depicts the complex amplitude trajectory of the mirror in FIG. 22a.

FIG. 22c depicts a pixel transfer function of the mirror in FIG. 22a.

FIG. 22d illustrates an array of pixel as illustrated in FIG. 22a.

FIG. 23a depicts an embodiment of a mirror.

FIG. 23b depicts the complex amplitude trajectory of the mirror in FIG. 23a.

FIG. 23c depicts a pixel transfer function of the mirror in FIG. 23a.

FIG. 24a depicts an off grid filter implementation

FIG. 24b depicts an off grid filter.

FIG. 25a depicts an embodiment of a mirror.

FIG. 25b depicts the complex amplitude trajectory of the mirror in FIG. 25a.

FIG. 25c depicts a pixel transfer function of the mirror in FIG. 25a.

FIG. 26b depicts the complex amplitude trajectory of the mirror in FIG. 26a.

FIG. 26c depicts a pixel transfer function of the mirror in FIG. 26a.

FIG. 27b depicts the complex amplitude trajectory of the mirror in FIG. 27a.

FIG. 27c depicts a pixel transfer function of the mirror in FIG. 27a.

FIG. 28b depicts the complex amplitude trajectory of the mirror in FIG. 28a.

FIG. 28c depicts a pixel transfer function of the mirror in FIG. 28a.

FIG. 29b depicts the complex amplitude trajectory of the mirror in FIG. 29a.

FIG. 29c depicts a pixel transfer function of the mirror in FIG. 29a.

FIG. 30a depicts an embodiment of a mirror.

FIG. 30b depicts the complex amplitude trajectory of the mirror in FIG. 30a.

FIG. 30c depicts a pixel transfer function of the mirror in FIG. 30a.

FIG. 31b depicts the complex amplitude trajectory of the mirror in FIG. 31a.

FIG. 31c depicts a pixel transfer function of the mirror in FIG. 31a.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Spatial light modulators come in two varieties, a deflection type and a phase type. The differences between them may in a particular case with micromirrors seem small but the phase SLM extinguishes the beam in a specular direction by destructive interference, while a pixel in a deflection SLM deflects the specular beam geometrically to one side so that it misses an aperture of an imaging lens. The deflection type SLM have pixels which operate digitally, i.e., said pixels may be set to two states only fully on and fully off. Said kind of pixels are said to be operated in a digital mode. The phase type SLM have pixels which operate in an analog mode, i.e., said pixels may be set to a numerous states between fully off and fully on. In one embodiment there are 63 states between fully off and fully on, i.e., 65 states in total. A degree of deflection of a micro-mirror determines which state said mirror would be in. All different states correspond to different gray-levels, which may be used to move edges of features to be printed.

Figure 1:
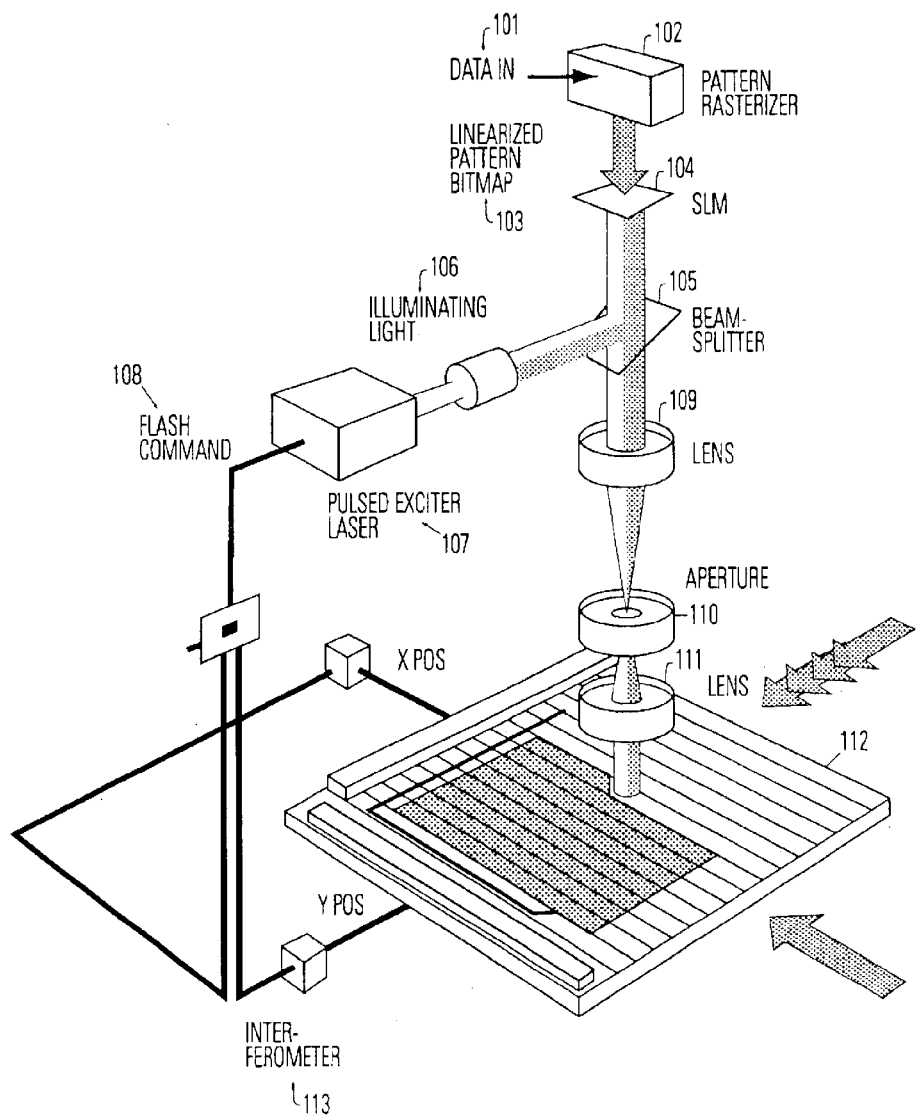
FIG. 1 depicts the general layout of an SLM pattern generator.

FIG. 1 depicts the general layout of an SLM pattern generator. Aspects of an SLM pattern generator are disclosed in the related-pending patent applications identified above. The workpiece to be exposed sits on a stage 112. The position of the stage is controlled by precise positioning device, such as paired interferometers 113.

The workpiece may be a mask with a layer of resist or other exposure sensitive material or, for direct writing, it may be an integrated circuit with a layer of resist or other exposure sensitive material. In the first direction, the stage moves continuously. In the other direction, generally perpendicular to the first direction, the stage either moves slowly or moves in steps, so that stripes of stamps are exposed on the workpiece. In this embodiment, a flash command 108 is received at a pulsed excimer laser source 107, which generates a laser pulse. This laser pulse may be in the deep ultraviolet (DUV) or extreme ultraviolet (EUV) spectrum range. The laser pulse is converted into an illuminating light 106 by a beam conditioner or homogenizer.

A beam splitter 105 directs at least a portion of the illuminating light to an SLM 104. The pulses are brief, such as only 20 ns long, so any stage movement is frozen during the flash. The SLM 104 is responsive to the datastream 101, which is processed by a pattern rasterizer 102. In one configuration, the SLM has 2048×512 mirrors that are 16×16 um each and have a projected image of 80×80 nm. It includes a CMOS analog memory with a micro mechanical mirror formed half a micron above each storage node.

The electrostatic forces between the storage nodes and the mirrors actuate the mirrors. The device works in diffraction mode, not specular reflectance, and needs to deflect the mirrors by only a quarter of the wavelength (62 nm at 248 nm) to go from the fully or state to the fully off-state. To create a fine address grid the mirrors are driven to on, off and 63 intermediate values. The pattern is stitched together from millions of images of the SLM chip. Flashing and stitching proceed at a rate of 1000 stamps per second. To eliminate stitching and other errors, the pattern is written four times with offset grids and fields. Furthermore, the fields may be blended along the edges.

The mirrors are individually calibrated. A CCD camera, sensitive to the excimer light, is placed in the optical path in a position equivalent to the image under the final lens. The SLM mirrors are driven through a sequence of known voltages and the response is measured by the camera. A calibration function is determined for each mirror, to be used for real-time correction of the grey-scale data during writing. In the data path, the vector format pattern is rasterized into grey-scale images, with grey levels corresponding to dose levels on the individual pixels in the four writing passes. This image can then be processed using image processing. The final step is to convert the image to drive voltages for the SLM. The image processing functions are done in real time using programmable logic. Through various steps that have been disclosed in the related patent applications, rasterizer pattern data is converted into values 103 that are used to drive the SLM 104.

In this configuration, the SLM is a diffractive mode micromirror device. A variety of micromirror devices have been disclosed in the art. In an alternative configuration, illuminating light could be directed through a micro-shutter device, such as in LCD array or a micromechanical shutter.

An SLM pattern generator, such as a mask writer or direct writer, that uses a grey-scale sampled image enables a variety of enhancement schemes. The grey value of each pixel is an area sample value of the pattern. Taking into account the imaging properties of the tool and a desired response, such as a specific corner radius, adjustments of the exposure values in a predetermined vicinity of a corner feature can be used to mimic or match the properties of another pattern generator, such as the exposed corner radius and corner pull back. The adjustment recipe can be adapted to match, for instance, another mask writer. To do this, exposed pattern properties in resist on workpieces of the two pattern generators can be compared. The comparison can be based on either simulation, developed resist or latent images in resist. Comparison of the exposed patterns allows adjustment of one or more process control parameters until the exposed patterns essentially match.

Data is modified in the raster domain of at least one of the pattern generators according to the process control parameters, rather than modifying vector-based pattern data in the design domain. The process control parameters may relate to corner feature exposure properties.

Figure 2:
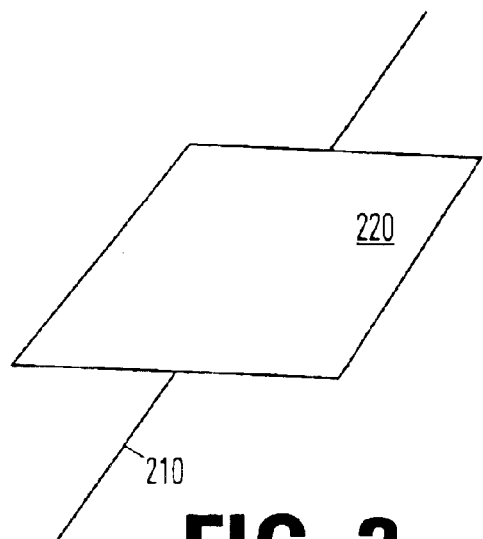
FIG. 2 depicts in a perspective view a prior art square mirror.

A mirror consisting of an essentially square mirror plate pivoting around an axis defined by torsion hinges in the plane of the mirror, see FIG. 2, modulates the beam from fully-on to filly-off. The fully-off state depends on the illumination of the mirror. The illuminator defines an angular subtense, which in turn determines the lateral coherence of the illumination light. The lateral coherence is in this sense different from the temporal coherence.

Temporal coherence usually means that the radiation comes from a laser, but lateral coherence can be produced by any light source made to illuminate a surface under a small enough angular spread. This is well known in the art and described in text books such as Born and Wolf: Principles of optics.

Figure 6A:
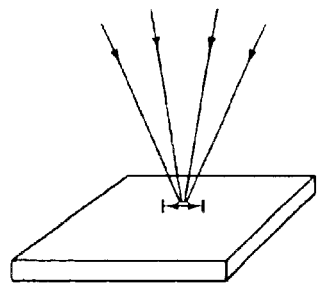
FIGS. 6a–b illustrate the relation between coherence length and angular spread
Figure 6B:
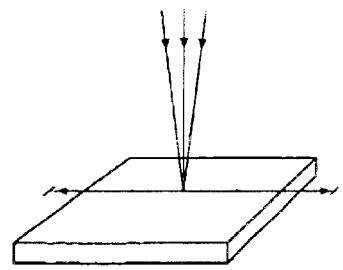

The notion of lateral coherence length is significant to this discussion. The lateral coherence length is of the order of the typical or center wavelength of the radiation divided by the angular spread of the illuminating beam. Projectors known in prior art (such as those used by Texas Instruments in their DLP technology and Daewoo in their AMA projectors) have used a high angular spread leading to a coherence length smaller than the size of an individual mirror element, see FIG. 6a. With this type of illumination each mirror acts as an independent specular reflector. The pattern generators disclosed and made by the applicant do on the other hand use a small angular spread in the illuminating beam, giving a coherence length that is of the same order as a mirror element or larger, see FIG. 6b. The effect is that different areas of a mirror interact by interference and that destructive or constructive interference effects also occur between mirror elements. The two different types of projectors will be called incoherent and partially coherent projectors respectively, the term projectors in this case meaning a generic image-forming system using an SLM, an illuminator and a projection system including a spatial filter. Incoherent projector are defined by the property of not forming a partially or fully coherent image, which can be due to the illumination mode, but also to a superposition of pixels at different times. The case where two or more fully coherent images are superimposed sequentially is considered as partially coherent.

Under illumination where the lateral coherence extends over a full mirror, the mirror does not act as a simple analog light valve any more, but a complex amplitude modulator. The complex amplitude is related to the electric field of the radiation, while the intensity is more akin to the energy density or energy flow. An interesting property of the complex amplitude is that it can have a negative sign, see curve 320 in FIG. 3, while the intensity (energy flow) is always positive, see FIG. 310 in FIG. 3. With the illumination scheme that produces laterally coherent light it is possible for one light beamlet to cancel the light of another one. The consequence is that suitably conditioned radiation can be added to reduce the light intensity at a point were it is desired to be dark, thereby improving contrast.

Figure 3:
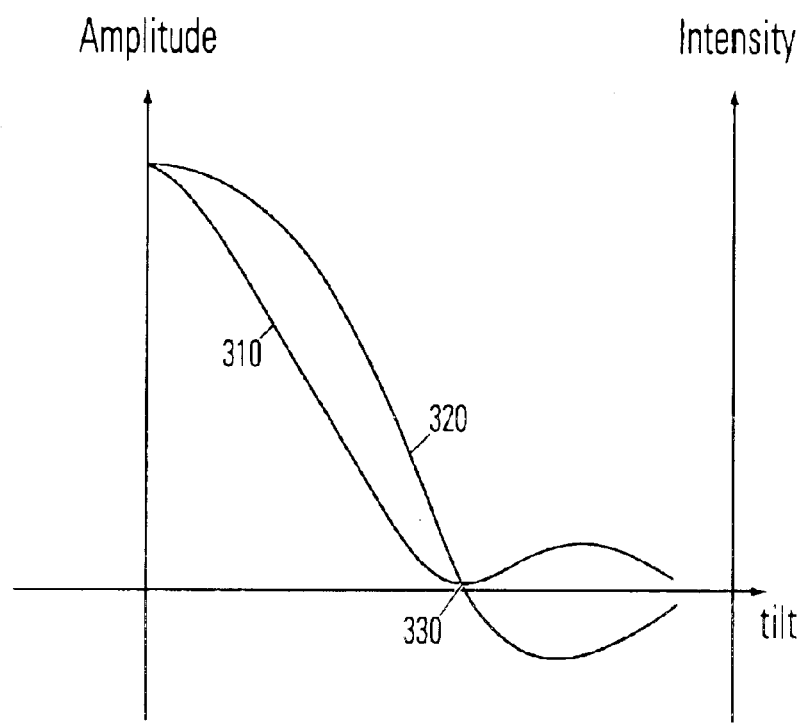
FIG. 3 depicts the reflected intensity and complex amplitude as function of the tilt angle of the mirror element.

The square mirror 220 tilting along one of its axis 210 acts as a specular mirror when it is parallel to the plane of the surface. When it is successively tilted out of the plane the edges move out of phase and become more and more destructive, giving perfect extinction of the light when they have a phase shift of +/−180 degrees in reflection, see point 330. But if the mirror is tilted more they continue further into the negative and the entire mirror gives negative complex amplitude. FIG. 3 shows this. The complex amplitude reflectivity of a mirror R can be calculated as the double integral over the mirror surface S 510 of the complex amplitude reflection r of every surface element Ds 520.

$$R = \frac{\oint_S r * dS}{\oint_S dS}$$

The denominator is the reflecting area of the mirror. In a more general case with varying reflectivity the expression can be generalized to include differences between the surface elements. In the most simple case with a perfectly reflecting surface the complex amplitude reflectivity r of a surface element is $r = e^{-i(4\pi h/\lambda)}$, where h 530 is the height of the mirror surface 510 above a reference surface 540. The reference surface 540 can be chosen arbitrarily (and the complex amplitude reflectivity R can be multiplied with an arbitrary but constant phase factor $e^{i\Phi}$) with no change in the physics. For definiteness the reference surface 540 is chosen here to be the plane through the hinges 550, giving R=1 for a flat non-tilted mirror.

FIG. 3 shows the reflected intensity and complex amplitude as functions of the tilt angle. With a symmetric mirror making a perfect pivoting action around a symmetry axis the imaginary part of R is always zero. The real part of R varies from 1.00 through 0.00 to a minimum of −0.22. For higher tilt angles it becomes positive again and approaches R=0 in the limit, see FIG. 4. For the square mirror the tilt for the first null R=0 occurs when the tilt is half a wavelength from one side to the other of the mirror, see point 330 in FIG. 3. It is easy to see why this gives zero: because it is a reflective device the phase in the light beam varies from −180 to +180 degrees. For each surface element with phase α there is another surface element with phase α+180 degrees, thus the reflection from every surface element is cancelled. Incident energy is diffracted away from the specular direction and does not find its way through at least one stop in projection optics.

The pattern generators developed by the applicant have used the reflectivity range 0<R<1 to print a pattern, where R=0 is used for area elements intended to be unexposed and R=1−ϵ is used for exposed areas. The term ϵ, which is typically 10%, is introduced to allow even exposure even in the presence of some statistical variation in R from mirror to mirror.

A fine address grid, much finer than that given by the mirrors, is created by giving mirrors at the edge intermediate values. These values are interpolated between exposed and unexposed mirror tilts, times a nonlinear function, the illumination table. The illumination table is implemented as a look-up table that is pre-computed or determined experimentally. The shape of the illumination function depends on a number of factors, most important on the projected mirror size compared to the optical resolution and the angular spread of the illuminating radiation.

In the incoherent projector the complex quantity R does not have any meaning, since the surface integrals only have meaning for lateral coherence lengths on the scale of the mirror size.

Figure 4:
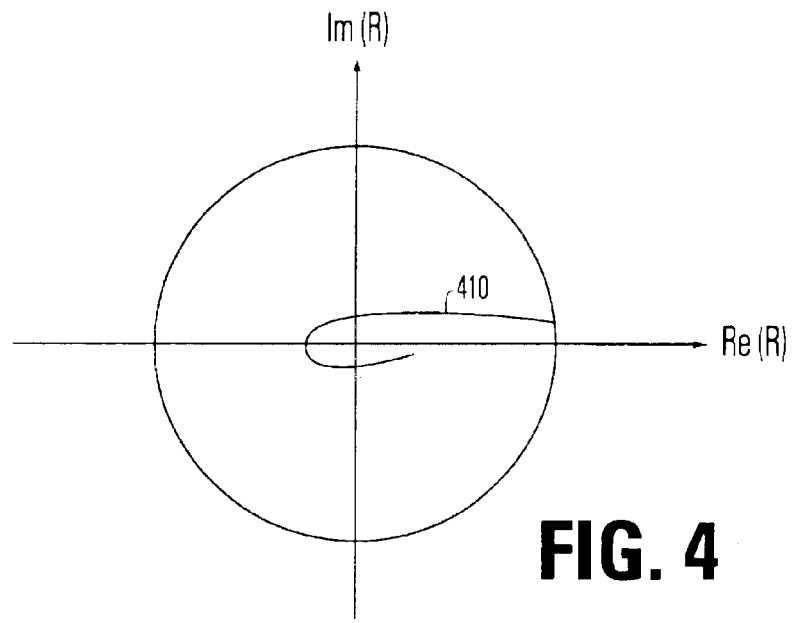
FIG. 4 depicts the real and imaginary part of the complex amplitude for the mirror element depicted in FIG. 2.
Figure 5A:
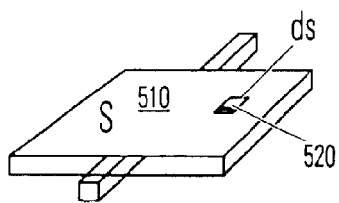
FIGS. 5a–b depict the mirror comprising reference surface and surface element.
Figure 5B:
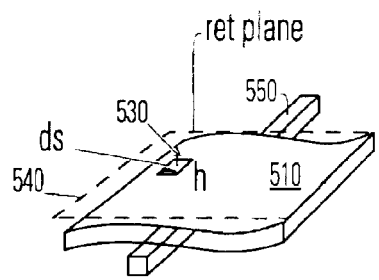

The quantity R is defined as a complex amplitude reflectivity in a partially coherent projector, not as the normal intensity reflectivity relevant in an incoherent projector. As described above R is a complex number and may have any value as long as $|R| \leq 1$. With the symmetrical mirrors Im (R)=0, but R can still be negative, and does in fact do so for tilts larger than half a wavelength. This can be used for image enhancement that is not possible in incoherent projectors. FIG. 4 depicts an example of a complex amplitude reflectivity curve 40.

One type of image enhancement is achieved by selecting the a value of R<0 for areas that are intended to be unexposed. A typical value is R=−0.15. This corresponds to an intensity reflection of 2.25% and gives a background exposure of 2.25% is areas that are intended to be unexposed. However, 2.25% is not enough to cause the photo resist (or more generally the photosensitive surface) to develop, since it has a development threshold typically around 30%. But exposed features get crisper edges since the −0.15 reflectivity, having phase 180 degrees, cancels light with phase 0 degrees at the perimeter of the exposed features. The dark areas get larger, the edge steeper and if the size is compensated with more dose the edge enhancement is even further enhanced.

FIG. 7a illustrates a prior art method of patterning features using an SLM. SLM pixels inside a feature to be patterned, hatched pixels in FIG. 7a, have a complex amplitude reflectivity R equal to 0. Pixels outside said feature, non-hatched pixels in FIG. 7a, have a complex amplitude reflectivity being equal to 1. The illustrated example in FIG. 7a, have feature edges coinciding with a pixel grid of the SLM. For this reason pixel elements defining the edge of the feature also have complex amplitude reflectivity equal to 0.

If, however the feature edge falls between the pixel grid, said complex amplitude reflectivity will be any value in the range of 0<R<1. The value of R is depending on the placement of said edge.

In FIG. 7a a graph 710 represents the complex amplitude of reflectivity R taken along a line A—A. FIG. 7b illustrates the inventive method for creating features with increased edge acuity and placement accuracy. Here the pixels inside the feature, hatched pixels in FIG. 7b, have complex amplitude less than 0, i.e., a negative value. A graph 720 represents the complex amplitude reflectivity taken along line B—B. Inserted in FIG. 7b is also the graph representing the intensity of reflectivity $|R|^2$.

The use of negative R is analogous to the use of so-called attenuated or embedded phase shifting masks in lithography. The value of R to be selected at will between 0 and a minimum value. At first sight is seems that the minimum value is −0.218. This corresponds to 4.77% exposure, less than 6% attenuated masks used in state-of-the-art lithography.

Closer analysis shows that it is not the maximum exposure dose E that is creating the effect but the value of the complex amplitude A in black areas relative to the complex amplitude in bright ones. Disregarding again a constant phase factor together with some prefactors that may be present.

$A = R * \sqrt{E}$, where E is the exposure dose. Using an R<1.00 as described above leads to a higher exposure dose and the minimum also gets larger in proportion.

The minimum value of A for the square mirror is $$A_{min} = A_{exposed} * \frac{-0.218}{(1-\varepsilon)}$$

If we choose $\varepsilon$=15% we get $A_{min}$=−0.256. This corresponds to an intensity of 6.6%, which is with a small margin equivalent to the industry-standard 6% attenuated mask blanks. In an SLM writer the dose and the mirror tilts are under software control, so even larger $\varepsilon$ can be used to get more negative amplitude. The restrictions are twofold: first, increasing the dose causes problems by itself, such as the creation of more stray light. Second, imperfections in the mirrors get magnified. However, these limitations are purely practical and the use of high E and strongly negative R cannot be ruled out beforehand, In previously implemented rasterizers the value of the pixel of mirror at the feature edge has been calculated as an interpolation between the exposed and unexposed value based on how much of the pixel falls on the exposed feature. Before it is converted to drive signals for the SLM.

Image modulator elements it is corrected through the illumination table LUT as described above.

In a further improvement a digital filter (term taken in a wide sense) is applied to the rasterized data to enhance edges and corners. The filter can be designed and implemented in many ways: linear or non-linear, based on rules or mathematical operations. One of the simplest rules is that whenever a pixel has a neighbor that is gray (i.e. has an intermediate value) the current pixel is enhanced, so that a white pixel gets whiter (more positive) and a black pixel gets blacker (less positive). In an incoherent projector the range of pixel values is limited to zero to full illumination, in the partially coherent projector the pixel value has the range $A_{min} < A < A_{max}$ where $A_{min}$ can be negative.

Figure 8A:
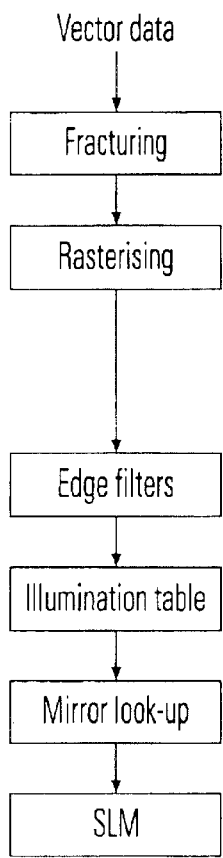
FIGS. 8a–c depict different ways of creating data to be fed to an SLM.
Figure 8B:
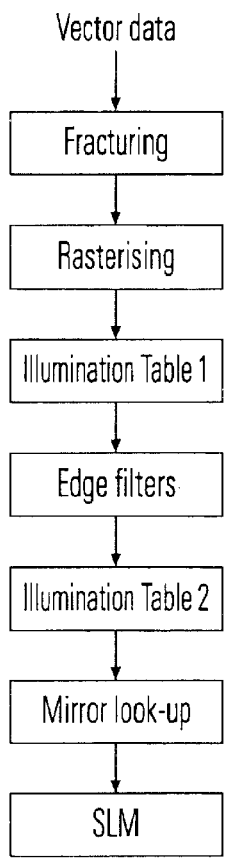
Figure 8C:
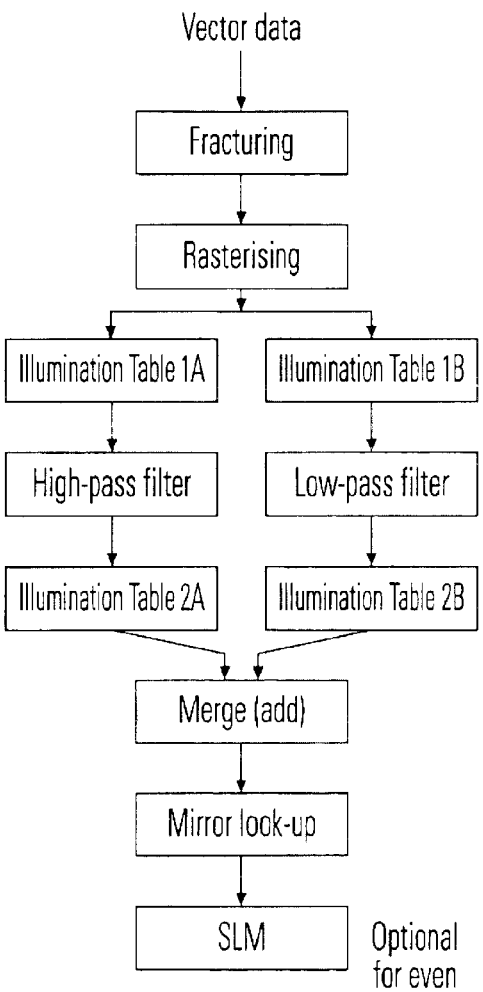

FIG. 8a illustrates the way drive signals are converted before being fed to the SLM according to a first embodiment. Vector data is fractured and rasterized according to well-known principles in the art. Edge filters are applied according to methods described above and below. The illumination table and mirror look up table is used before the final drive signal is created. In FIG. 8b another embodiment is illustrated which uses two illumination tables instead of one. By doing so better CD control may be achieved. FIG. 8c illustrates yet another embodiment which splits the rasterized data into two parallel branches. A first branch uses a first and second illumination table 1a, 1b, and a high pass filter. A second branch uses a third and a fourth illumination table and a low pass filter. Data split into high frequency and low frequency data. One could also split the data into x and y branches, meaning that a first branch is optimized for data only in a y direction and a second branch optimizes data only in an x direction, where x and y could be horizontal and vertical data.

The availability of negative pixel values in the partially coherent projector gives more corrective power than positive-only. In particular it makes it possible to improve both resolution and contrast of fine lines.

The digital image enhancements are comparatively easy to make in the bitmap domain. The pattern is typically input in a hierarchical vector format such as GDSII, MIC or OASIS. The ordering of data in the input file obeys no rules and a contiguous geometrical feature can be formed from several elements from different parts of the hierarchical structure. The hierarchy is flattened and all neighbor and overlap relations are resolved when the bitmap is created. Thus the bitmap operations need only look at local information, in contrast to operations in the vector format.

Figure 32A:
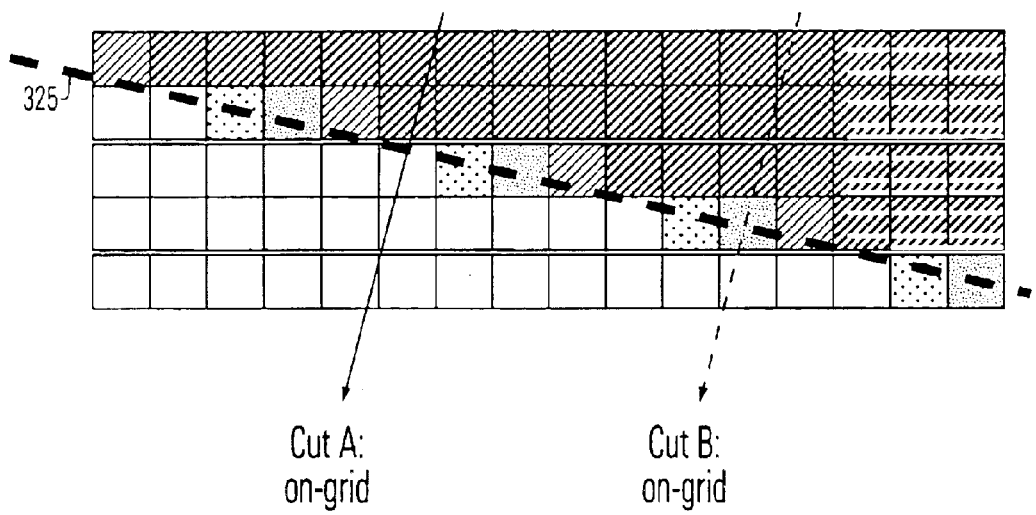
FIG. 32a depicts a slanted line and its rasterized pixel representation
Figure 32B:
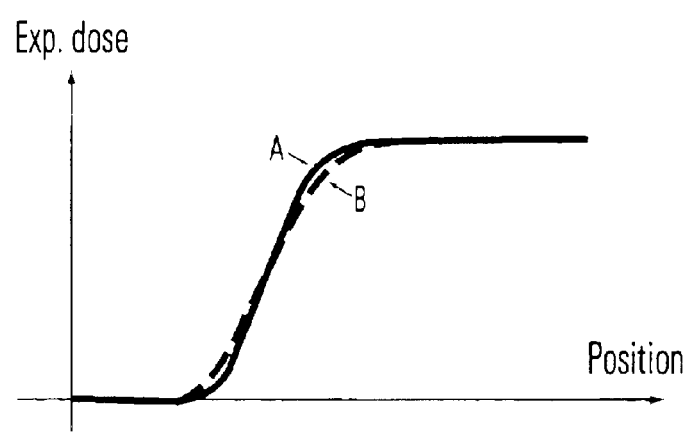
FIG. 32b depicts the exposure dose as a function of the position of said slanted line.

A close look at the rasterizing process shows that it acts as a low-pass filter at some grid positions and not at others. When the edge is placed relative to the edge so that an intermediate pixel value is created some of the edge acuity of the optical system is lost. This can be represented with a low-pass filter, FIGS. 32a, 32b, at other grid positions where the edge is represented without an intermediate value no loss of acuity occurs. FIG. 32a illustrates a slanted line 325 and corresponding pixel data. A cut at A illustrates that said slanted line 325 lies on grid. FIG. 32b illustrates exposure dose as function of position. Graph A represents when the line is n grid and graph B represents when the line is off-grid, such as at A cut at B in FIG. 32a. FIG. 32b illustrates that the graph is steeper for on grid position compared to off-grid positions.

Figure 33A:
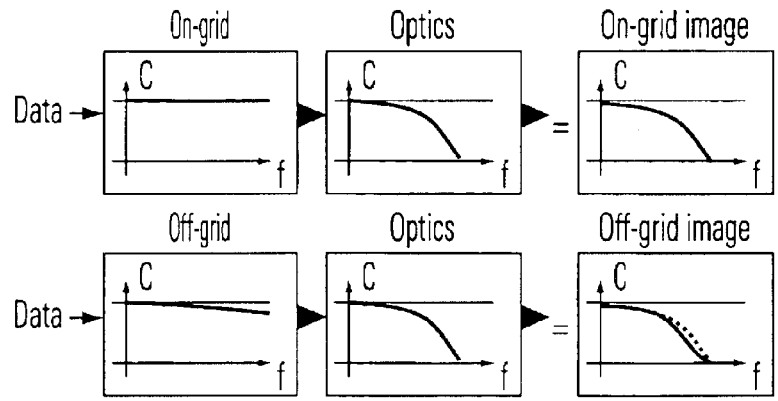
FIG. 33a illustrates the contrast as a function of spatial frequency for on-grid pixels and off-grid pixels without any grid filter.

FIG. 33a illustrates contrast versus spatial frequency for on-grid pixels and off-grid pixels without any grid filter. The upper sequence illustrates on-grid pixels and the lower sequence illustrates off-grid pixels. Here it is clearly illustrated that off-grid pixels, i.e., a feature edge that does not fall on the grid position for SLM pixels, act as a low pass filter. The optics in a pattern generator also works as a low pass filter. The combination of the optics and the on grid gives an image with a certain low pass characteristic. The combination of off grid and the optics gives an image with another low pass characteristic (solid line) than what is expected, dotted line in FIG. 33a.

Figure 33B:
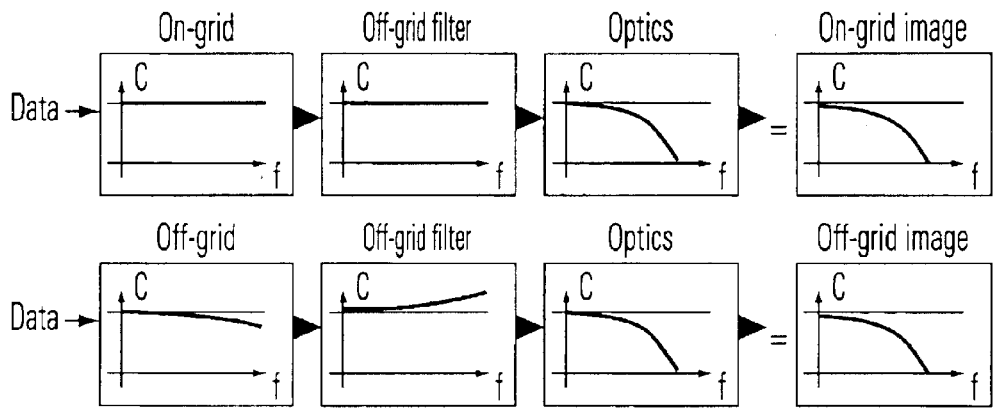
FIG. 33b illustrates the contrast as a function of spatial frequency for on-grid pixels and off-grid pixels with an off-grid filter.

FIG. 33b illustrates the contrast as a function of spatial frequency for on-grid pixels and off-grid pixels with an off-grid filter. Here the off-grid filter counteracts the low pass performance caused by the off grid position. The off grid image has equivalent contrast versus spatial frequency performance as the on grid image.

Figure 33C:
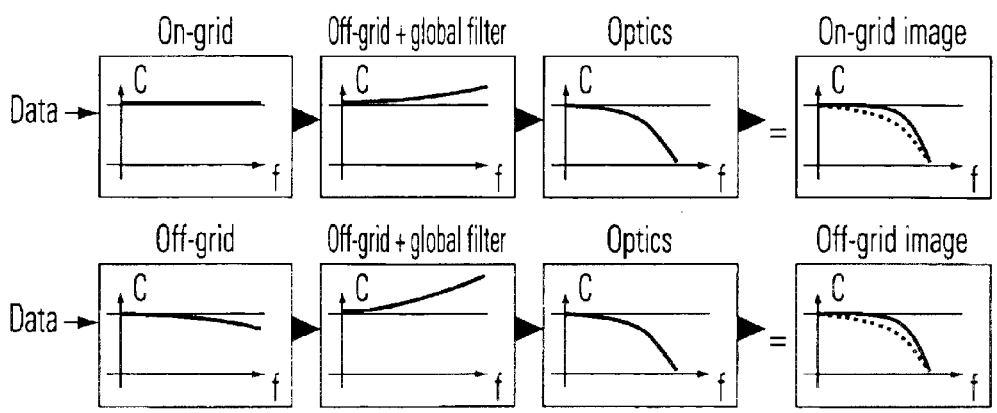
FIG. 33c illustrates the contrast as a function of spatial frequency for or) grid pixels and off-grid pixels with off-grid filter and global edge enhancement.

FIG. 33c illustrates the contrast as a function of spatial frequency for on-grid pixels and off-grid pixels with off-grid filter and global edge enhancement. The global filter enhances the contrast versus spatial frequency characteristics in that the graph is steeper in both the on-grid and off-grid image compared to the graph in the on-grid and off-grid image without said global filter (dotted graph). A steeper function will enhance edge placement accuracy and edge acuity.

Figure 34:
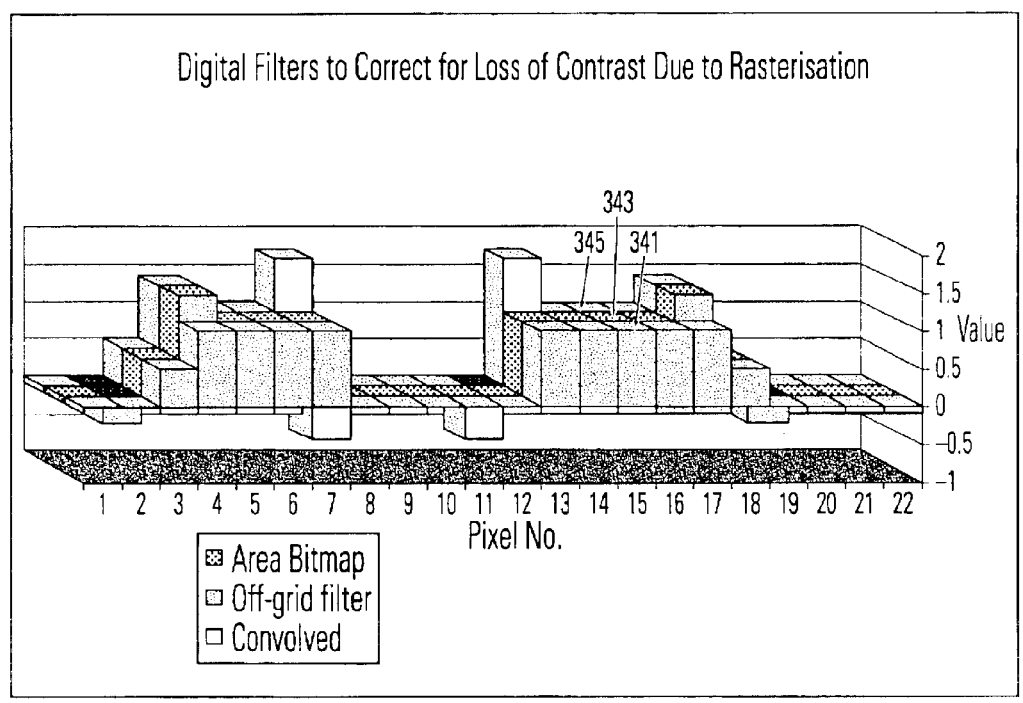
FIG. 34 illustrates a diagram showing contrast as a function of pixel number.

FIG. 34 illustrates a diagram showing contrast as a function of pixel number. Pixels 341 illustrates the area bitmap for a certain pattern. Pixels 343 illustrates said pixels with an off-grid filter applied. Pixels 345 illustrates convolved pixels, i.e., with a global edge enhancement. The global enhancement enhances all edges, while the off-grid filter enhances only edges with an intermediate value for the edge pixel.

Figures 10A, 10B:
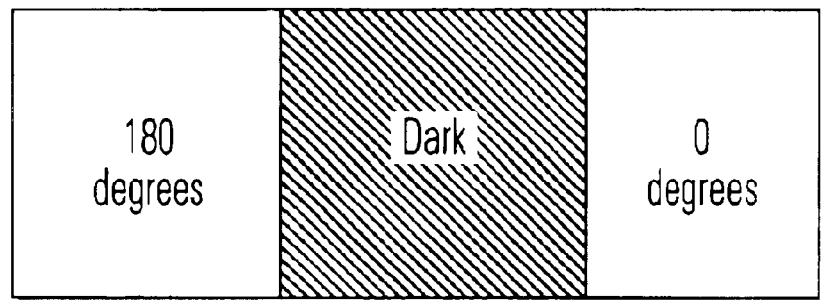

FIG. 10a illustrates an alternating phase shift mask. The leftmost area is phase shifted 180 degrees relative to the rightmost area. The middle area is dark. A representation of said alternating phase shift mask as complex amplitude reflectivity values is illustrated in FIG. 10b. Here it is illustrated that the transition from dark to bright is not performed in one step bur through an intermediate step. −1 corresponds to the 180 degrees area, +1 corresponds to the 0 degree area, 0 corresponds to the dark area, −0,6 corresponds to the leftmost transition step and 0,3 corresponds to the rightmost transition step.

The remedy is what will be called an off-grid filter, a filter that detects that the edge is at an interpolated position and sharpens the edge by an appropriate amount to counteract the softening action of the rasterization. Edge sharpening by itself is well known in the image processing, although it is not common to have negative values available. One edge-sharpening operation is convolution with a partially derivative kernel. Such a kernel can look as follows:

$$D = \begin{pmatrix} -0.1 & -0.2 & -0.1 \\ -0.2 & +2.2 & -0.2 \\ -0.1 & -0.2 & -0.1 \end{pmatrix}$$

Convolved with a bitmap $B_{in}$ it produces a new bitmap $B_{out}$.

$$B_{out} = B_{in} \hat{X} D$$

The following is an example bitmap and how the edge is enhanced by the convolution $$B_{in} = \begin{pmatrix} . & . & . & . & . & . & . & . & . \\ . & . & . & . & . & . & . & . & . \\ . & 100\% & 100\% & 100\% & 50\% & 0\% & 0\% & 0\% & . \\ . & 100\% & 100\% & 100\% & 50\% & 0\% & 0\% & 0\% & . \\ . & 100\% & 100\% & 100\% & 50\% & 0\% & 0\% & 0\% & . \\ . & 100\% & 100\% & 100\% & 50\% & 0\% & 0\% & 0\% & . \\ . & 100\% & 100\% & 100\% & 50\% & 0\% & 0\% & 0\% & . \\ . & . & . & . & . & . & . & . & . \\ . & . & . & . & . & . & . & . & . \end{pmatrix}$$

$$B_{out} = \begin{pmatrix} . & . & . & . & . & . & . & . & . \\ . & . & . & . & . & . & . & . & . \\ . & 100\% & 100\% & 120\% & 50\% & -20\% & 0\% & 0\% & . \\ . & 100\% & 100\% & 120\% & 50\% & -20\% & 0\% & 0\% & . \\ . & 100\% & 100\% & 120\% & 50\% & -20\% & 0\% & 0\% & . \\ . & 100\% & 100\% & 120\% & 50\% & -20\% & 0\% & 0\% & . \\ . & 100\% & 100\% & 120\% & 50\% & -20\% & 0\% & 0\% & . \\ . & . & . & . & . & . & . & . & . \\ . & . & . & . & . & . & . & . & . \end{pmatrix}$$

The derivative at the edge is increased by 40%. The following example shows how a corner is enhanced after convolution by the same kernel.

$$B_{in} = \begin{pmatrix} . & . & . & . & . & . & . & . & . \\ . & 100\% & 100\% & 100\% & 60\% & 0\% & 0\% & 0\% & . \\ . & 100\% & 100\% & 100\% & 60\% & 0\% & 0\% & 0\% & . \\ . & 100\% & 100\% & 100\% & 60\% & 0\% & 0\% & 0\% & . \\ . & 100\% & 100\% & 100\% & 60\% & 0\% & 0\% & 0\% & . \\ . & 40\% & 40\% & 40\% & 24\% & 0\% & 0\% & 0\% & . \\ . & 0\% & 0\% & 0\% & 0\% & 0\% & 0\% & 0\% & . \\ . & 0\% & 0\% & 0\% & 0\% & 0\% & 0\% & 0\% & . \\ . & . & . & . & . & . & . & . & . \end{pmatrix}$$

$$B_{out} = \begin{pmatrix} . & . & . & . & . & . & . & . & . \\ . & 100\% & 100\% & 116\% & 68\% & -24\% & 0\% & 0\% & . \\ . & 100\% & 100\% & 116\% & 68\% & -24\% & 0\% & 0\% & . \\ . & 100\% & 100\% & 116\% & 68\% & -24\% & 0\% & 0\% & . \\ . & 124\% & 124\% & 138\% & 81\% & -20\% & 0\% & 0\% & . \\ . & 32\% & 32\% & 39\% & 23\% & -11\% & 0\% & 0\% & . \\ . & -16\% & -16\% & -14\% & -9\% & -2\% & 0\% & 0\% & . \\ . & 0\% & 0\% & 0\% & 0\% & 0\% & 0\% & 0\% & . \\ . & . & . & . & . & . & . & . & . \end{pmatrix}$$

A convolution with a derivative kernel enhances all edges, i.e. it does a global edge enhancement. The off-grid filter is rule-based in the sense that it enhances only off-grid edges. The off-grid filter detects that the edge is interpolated and enhances it, while an edge that is not interpolated is left unchanged. A simple condition for interpolation is that the edge pixels have an intermediate value. The rule that only interpolated edges are enhanced can be expressed as an IF-THEN-ELSE rule in the bitmap domain, but a more elegant implementation is by means of multiplication with a weight function that continuously varies between a small magnitude in an on-grid position and a high magnitude in an off-grid position.

FIG. 24a illustrates an off-grid filter implementation. B is the bitmap from the rasterizer with values in the range 0–1. K is a coefficient array or kernel 3×5, 5×5 pixels or larger. W is a weighting bitmap used to weight the contribution to each entry in the bitmap B. $W_n = 4*(1-B_n)*B_n + \max(4*(1-B_{neighbors})*B_{neighbours})$. An adjusted value of $B_{13}$ is computed as:

$B_{13filtered} = B_{13} + W_{13}*(K_7*B_7 + \ldots + K_{19}*B_{19})$, where $W_{13} = 4*(1-B_{13})*B_{13} + \text{MAX}(4*(1-B_7)*B_7, \ldots, 4*(1-B_{12})*B_{12}, 4*1-B_{14})*B_{14}, \ldots, 4*(1-B_{19})*B_{19})$.

FIG. 24b illustrates an off-grid filter. B is the bitmap from the rasterizer with values in the range 0–1. G and F are derive d bitmaps used for the filter. Gn=2(Bn0.5). Fn=4(Bn−1)(Bn−0). K is a coefficient array or kernel 3×5, 5×5 pixels or larger. An adjusted value of $B_{13}$ is computed as:

$$B13\textit{filtered}=B13+K7^*G7^*F7^*B7+\ldots+K19^*G19^*F19^*B19.$$

The same or similar functions can be implemented in other ways, which is obvious for one skilled in the art.

The constants used in the edge enhancement and for the calculation of the "grayness" can be varied to produce as good results as possible for a variety of typical pattern elements, "use cases". They can be determined manually by controlled experiments or by simulations using codes such as PROLITH from KLA-Tencor or Solid-C from Sigma-C. In a more elaborate setup the use cases can be programmed into an optimization job using one of the simulators above and non linear optimization routines.

FIGS. 9a–d shows simulated performance of a manually fitted enhanced space (clear line). The vector data has one edge 912 on grid and one off grid 914. If it is rasterized without edge enhancements the result is an aerial image where the on-grid edge has higher acuity than the off-grid one. If the dose is varied the width of the trench varies, but the two edges 991, 992 move differently with dose. This is seen as a movement of the center of the space with dose. The diagram 9d shows the movement with dose of the center of the space without 970 and with 980 the off-grid filter. It is seen that with the off-grid edge enhanced the center of the space is stable over a very large dose interval. This is an alternative way to describe that the left and right edges in the aerial image are closely identical. A pixel within the feature 940 is set to a higher exposure value, here 116% compared to the rest of the pixels within the feature, which are set to 100%. A pixel 950 outside the feature is set to a negative black value, i.e., a negative complex amplitude reflectivity. The rest of the outside feature pixels are set to 0%.

The example in FIG. 9b has a minimum negative value of −0.72

=−0.085. It was shown above that the square mirrors could create value of −0.25 or even below. Therefore there is room for further edge enhancement using negative complex amplitude even after some of the dynamic range of the mirrors has been used for the off-grid filter. The operation can conceptually be expressed as a convolution with two parts.

$B_{out}=B_{in}\hat{X}\,(D_{global}{}^*D_{off-grid})$, where $D_{global}$ is the edge enhancement kernel for global edge enhancement, $D_{off-grid}$ the kernel for removing the difference between off-grid and on grid edges and g is the "grayness", the weight function that determines the application of $D_{off-grid}$.

In a further improvement the convolution kernel, or more generally the digital filter, has slightly different properties in the x and y directions to correct for inherent differences in edge acuity between x and y.

In order to print a true image of the input data the pixel values cannot be a linear representation of the overlap between the pixel area and the feature. There has to be a nonlinear transformation between overlap area and pixel value. Regardless if the representation of the pixel values is chosen to be tilt angle, actuator voltage, complex amplitude reflectivity R or $|R^2|$ a non-linear pixel-by-pixel transformation is needed: $V=I(A)^*A$ where V is the pixel value, A the area overlap from 0 to 100%, and I(A) is the illumination table. The illumination table I(A) describes the non-linearity of the system that arises from the partial coherence over the modulating element (mirror). The shape of the function depends on the pixel size relative to the optical resolution, the angular spread of the illuminating light, the used dynamic range of the SLM, and the relative dose (dose/dose-to-clear).

The illumination function can be determined empirically or through optical simulation. In either case the printing conditions such as NA, illuminator setting, pixel size, SLM contrast, and dose are fixed. A large feature is printed from vector data with the placement of one edge versus the grid varying, either in resist or virtually in a lithography simulator. The pixel value is a predetermined function of the feature overlap with the pixel area, possibly with a non-uniform weight function over the pixel area. The predetermined function can for example be a linear function.

The feature is printed for different edge placements and the placement of the printed edge is measured, either by a metrology system such as Leica IPRO or by numerical analysis of the simulated images. The measurement gives a non-linear function for placement vs. data. This non-linear function is used to compute the illumination table. The procedure can be repeated iteratively in order to arrive at a stable and accurate illumination table. This illumination table makes the printer print true to data for large features with the used printing conditions.

A preferred embodiment of the invention has the following order of conversions: see FIG. 8a 1. Flatten the hierarchical input database, 2. Rasterize all features and compute the overlap area of feature elements for every bitmap pixel (possibly using a non-uniform area sampling function per pixel) producing a so called area bitmap, 3. Make pattern corrections (preferably in real time) including edge enhancement and off-grid enhancement as well as special enhancement of corners and small features, producing a corrected area bitmap, 4. Multiply the corrected bitmap by the illumination function producing what is currently called an intensity bitmap, 5. Make a table look-up conversion of the intensity bitmap, the lookup table representing the properties of individual modulator elements or mirrors, producing a DAC value bitmap A slightly more complex conversion sequence gives more control of the nor-linearities of the rasterizing and partially coherent imaging: see FIG. 8b 1. Flatten the hierarchical input database, 2. Rasterize all features and compute the overlap area of feature elements for every bitmap pixel (possibly using a non uniform area sampling function per pixel) producing a so called area bitmap, 2b Multiply the area bitmap by a first illumination function, 3. Make pattern corrections (preferably in real time) including edge enhancement and off grid enhancement as well as special enhancement of corners and small features, producing a corrected area bitmap, 4. Multiply the corrected bitmap by a second illumination function producing what is currently called an intensity bitmap, 5. Make a table look-up conversion of the intensity bitmap, the lookup table representing the properties of individual modulator elements or mirrors, producing a DAC value bitmap In a third embodiment, see FIG. 8c the pattern is divided into two (possibly three or more) partial patterns, e.g. one containing more high-frequency information and another one containing more low-frequency information. The partial patterns are converted with different parameters before they are combined to drive the SLM. The decomposition is suitably implemented as different bitmap filters such as the convolutions described above. High and low frequency filtering of images is well known in the art of digital image processing and many methods and detailed implementations can be devised by a person skilled in the art.

In all embodiments the illumination function can be folded into the mirror look-up table. The minor LUT (Look Up Table) must then be changed depending on the angular spread of the illumination and the dose.

The illumination table makes the CD independent of the pixel grid, at least for large features. But the illumination does not make the aerial image acuity constant through grid. Features at the resolution limit tend to disappear, and features placed at grid positions where the acuity is compromised by the rasterization disappear first. Therefore line width CD is not stable through grid at the resolution limit.

The off-grid enhancement makes the image of on-grid and off grid identical. This makes all printing properties more stable, e.g. for varying dose. But the main benefit is that features at the resolution limit become much more stable. In this way the useful resolution is improved.

The global edge enhancement also increases the useful resolution. It increases the contrast of thin lines by extending the dynamic range of the SLM modulator elements. Edges are made crisper. Since small features have the edges close together they get a double boost.

Line ends are also improved, partly because all edges are made crisper, but also because the convolution with a derivating kernel enhances the contrast of line ends. Corners are likewise enhanced, although not as much as line ends. With properly chosen parameters line end shortening and CD linearity failures of lines and contacts can be largely counteracted. If the global enhancement is implemented as a convolution with a derivating kernel the size of the kernel and the coefficients in it can be used to determine the magnitude and detailed properties of the enhancement.

The complex amplitude of the square mirror and how it varies with the tilt angle is calculated as described above. It is influenced by the shape of the mirror. Other shapes give other characteristics and shown in FIGS. 14–23, 25–31.

Figure 18A:
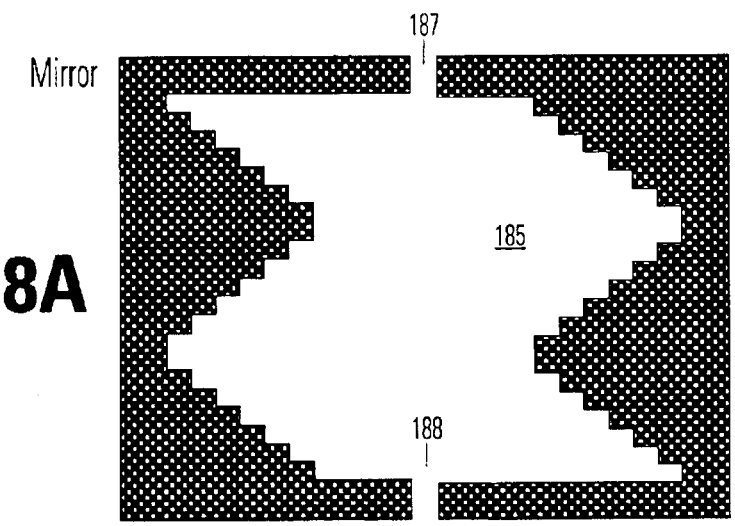
FIG. 18a depicts an embodiment of a mirror.
Figure 18B:
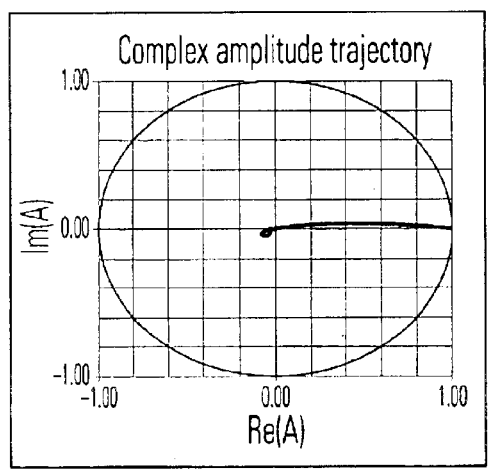
Figure 18C:
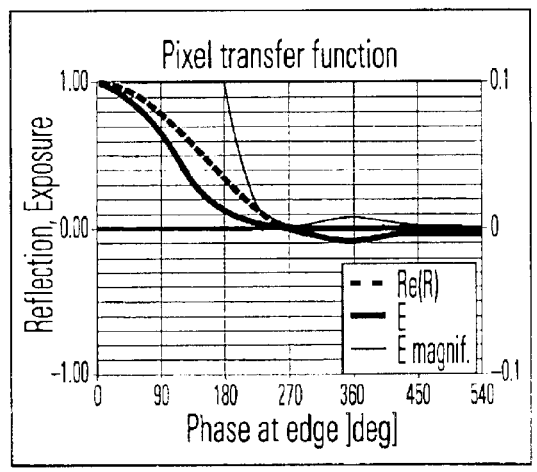
Figure 19A:
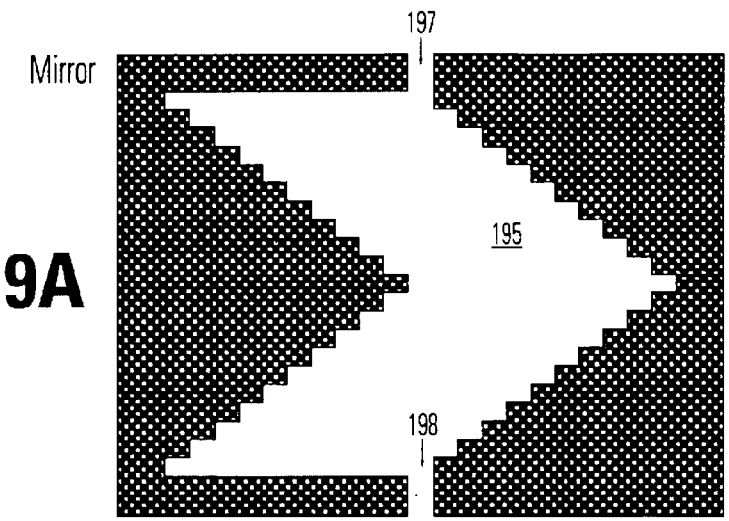
FIG. 19a depicts an embodiment of a mirror.

One can make a distinction between shapes that are area filling or not. For instance FIGS. 10a, 18a, 19a are surface filling. FIGS. 14a–23a, 25a–31a shows that many perfectly viable mirror shapes have radically different complex amplitude reflectivity. By selecting a different mirror shape one can get access to large amounts of negative R. Some of the shapes, like the H shape in FIG. 22a, can provide a symmetrical positive and negative R.

Figure 11A:
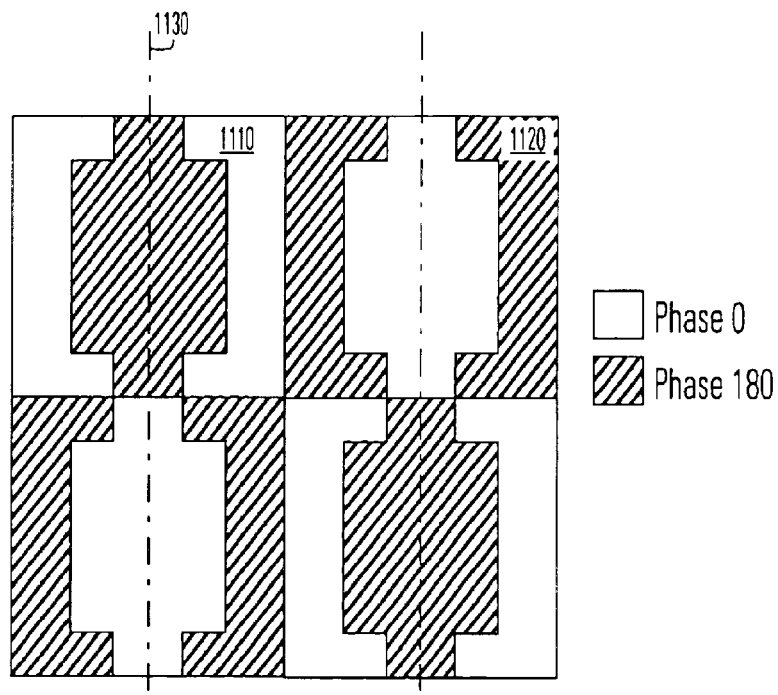
FIG. 11a depicts a 2×2 array of mirrors with different phase characteristics.

FIG. 11a depicts mirror configurations in a spatial light modulator, which may be used in order to achieve any desired pattern with improved image quality. Mirror 1110 and 1120 have their tilting axis along symmetry line 1130. Mirror 1110 have outer areas with phase 0 and inner area with phase 180. Mirror 1120 are reversed relative to mirror 1110, i.e., outer areas have phase 180 and inner area has phase 0. Mirror 1110 and 1120 are arranged in a chess board manner, i.e., mirror 1110 is surrounded by four 1120 mirrors and mirror 1120 is surrounded by four 1110 mirrors.

Figure 11B:
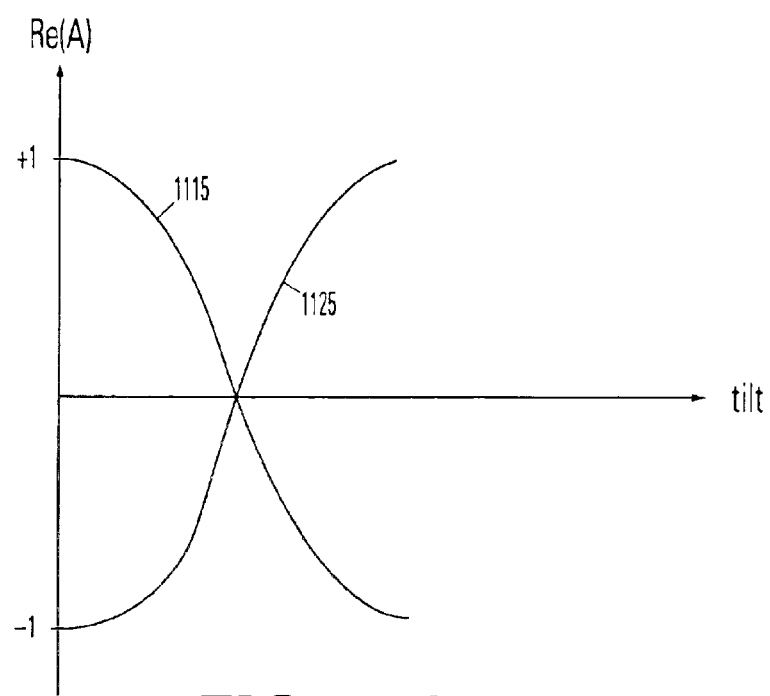
FIG. 11b illustrates a complex amplitude reflectivity as function of tilt of the mirror.
Figure 12A:
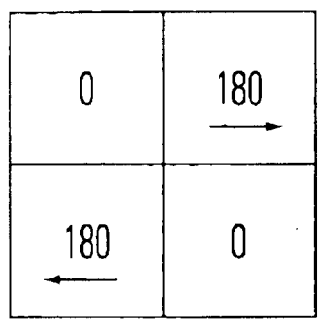
FIG. 12a illustrate 2×2 arrays of mirrors as depicted in FIG. 11a only differing in the way they are tilted.

FIG. 11b illustrates the real part of the complex amplitude reflectivity as function of a degree of tilting of the mirror. As can be seen from FIG. 11b, mirror element 1110 goes from +1 to −1 as the mirror is tilted and mirror element 1120 goes from −1 to +1 as the mirror is tilted. With mirror characteristics as depicted in FIGS. 11a and 11b patterns as depicted in FIGS. 12a–12e can easily be achieved. FIG. 12a illustrates a pattern with uniform phase 0. Only mirrors 1120, denoted in FIG. 12a with phase 180 and an arrow, are tilted. The direction of said arrow indicates the direction of tilting. Every second mirror is tilted in a reversed direction. However mirrors may all be tilted in the same direction.

Figure 12B:
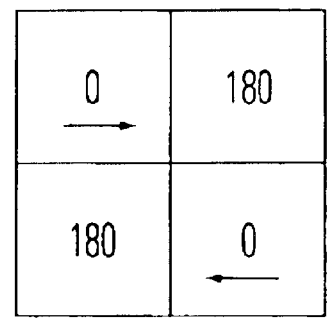

FIG. 12b illustrates a pattern with uniform phase 180. In FIG. 12b are only the mirrors 1110 tilted, denoted in FIG. 12b with phase 0 and an arrow. Here again a direction of said arrow indicates the direction of tilting said mirror.

Figure 12C:
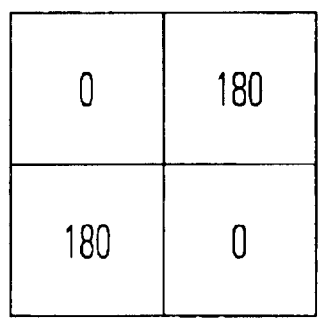
Figure 12D:
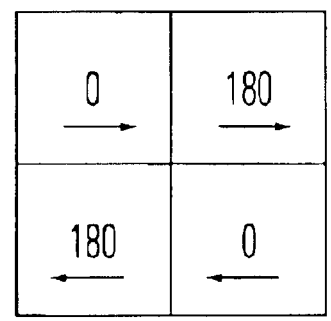
Figure 12E:
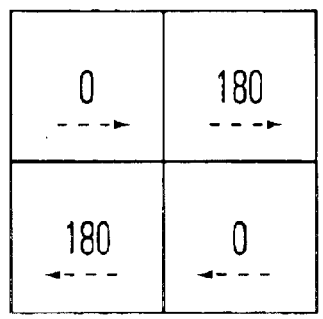

FIGS. 12c–e depict patterns with uniform dark. In FIG. 12c none of the mirrors are tilted. In FIG. 12d all mirrors are tilted. In FIG. 12e all mirrors are partially tilted. In FIG. 12c–e the direction of said arrow indicates the tilting direction of the mirror.

Controlling the characteristics of the mirrors with the shape leads to inflexible designs where a modest change in properties may necessitate a change in layout affecting both the CMOS underneath the MEMS and the rasterizing algorithms. It is possible to change the apparent shape of the mirrors by covering the unwanted parts of the mirrors with a non-reflecting layer, e.g. a dark metal like zirconium, an antireflection coating like a deposited metal oxide or other dielectric film as is well known in the art. A practical way of controlling the characteristics of the mirrors is by structures on the top surface of the mirror. One advantage is that it may use the same material as the rest of the mirror, another that, whatever material is used there is no requirement to reduce the reflectivity, since the effect of the surface structures is created by division of wavefront destructive interference and light scattering. The areas that are intended to be non-reflected can be patterned by structures that create destructive interference in the specular direction. An example is a checkerboard of squares with a step height of lambda over 4 (lambda over 2 in the reflected beam). It has been found that with partially coherent illumination the structures can be fairly large. FIG. 12 shows a number of possible designs and corresponding properties.

Figure 13A:
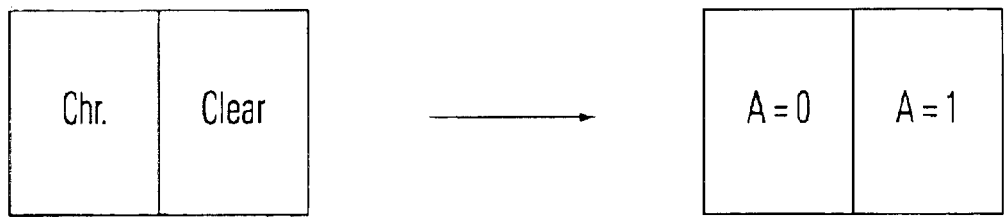
FIGS. 13a–13d illustrate the correspondence between different areas of masks/reticles and different areas of a SLM.

FIGS. 13a–d illustrates the correspondence between Masks or reticles and an SLM having similar properties. A leftmost illustration in FIG. 13a depicts a binary mask. The binary mask has a part, which is covered with a chrome layer. Said chrome layer is opaque. Next to the chrome layer said mask is clear, defining a fully transmissive part of said mask A rightmost illustration depicts an SLM with corresponding properties as said binary mask. The chrome part in said binary mask corresponds to a complex amplitude reflectivity A=0 and the clear part in said binary mask corresponds to a complex amplitude reflectivity A=1.

Figure 13B:
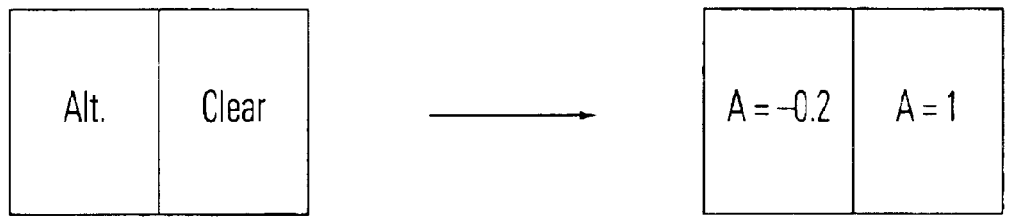

A leftmost illustration in FIG. 13b depicts an attenuating phase shift mask. The attenuating phase shift mask has a part, which is covered with a partly transmissive layer. Next to the partly transmissive layer said mask is clear, defining a fully transmissive part of said mask. A rightmost illustration depicts an SLM with corresponding properties as said attenuating phase shift mask. The partly transmissive layer in said attenuating phase shift mask corresponds to a complex amplitude reflectivity in the range of −1<A<0 and the clear part in said binary mask corresponds to a complex amplitude reflectivity A=1.

Figure 13C:
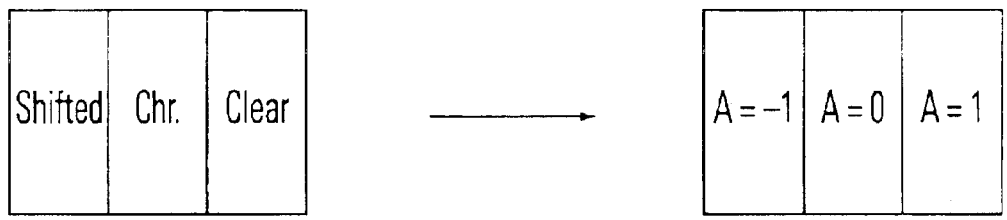

A leftmost illustration in FIG. 13c depicts an alternating phase shift mask. The alternating phase shift mask has a first part, which is covered with a chrome layer. Said chrome layer is opaque. At one side of the chrome layer said mask is clear, defining a fully transmissive part of said mask. At another side of said chrome layer said mask is shifted in phase relative said chrome layer and said clear part. A rightmost illustration depicts an SLM with corresponding properties as said alternating phase shift mask. The chrome part in said alternating phase shift mask corresponds to a complex amplitude reflectivity A=0. The clear part in said alternating phase shift mask corresponds to a complex amplitude reflectivity A=1. The shifted part in said alternating phase shift mask corresponds to a complex amplitude reflectivity A=−1.

Figure 13D:
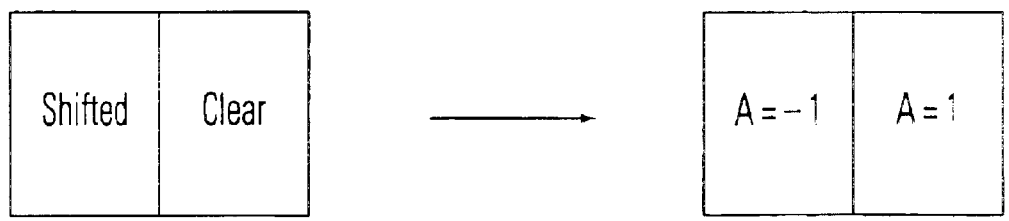

A leftmost illustration in FIG. 13d depicts a CPL (Chrome-less Phase Lithography) mask. The CPL mask has a part, which is covered with a shifted layer. Said shifted layer is clear and fully transmissive. Next to the shifted layer said mask is clear, defining a fully transmissive part of said mask. The shifted part has its surface higher or lower than said clear part. The rightmost illustration depicts an SLM with corresponding properties as said CPL mask. The shifted part in said CPL mask corresponds to a complex amplitude reflectivity A=−1 and the clear part in said CPL mask corresponds to a complex amplitude reflectivity A=1.

The different parts in FIGS. 13a–d comprises typically a plurality of pixel elements, i.e., in the SLM case said areas are represented by a plurality of SLM pixels, the number depending on the size of the feature to be patterned.

FIGS. 14–31 illustrates different mirror configurations and corresponding complex amplitude trajectory, complex amplitude reflectivity graph and exposure graph as a function of phase at an edge of the mirror.

Figure 14A:
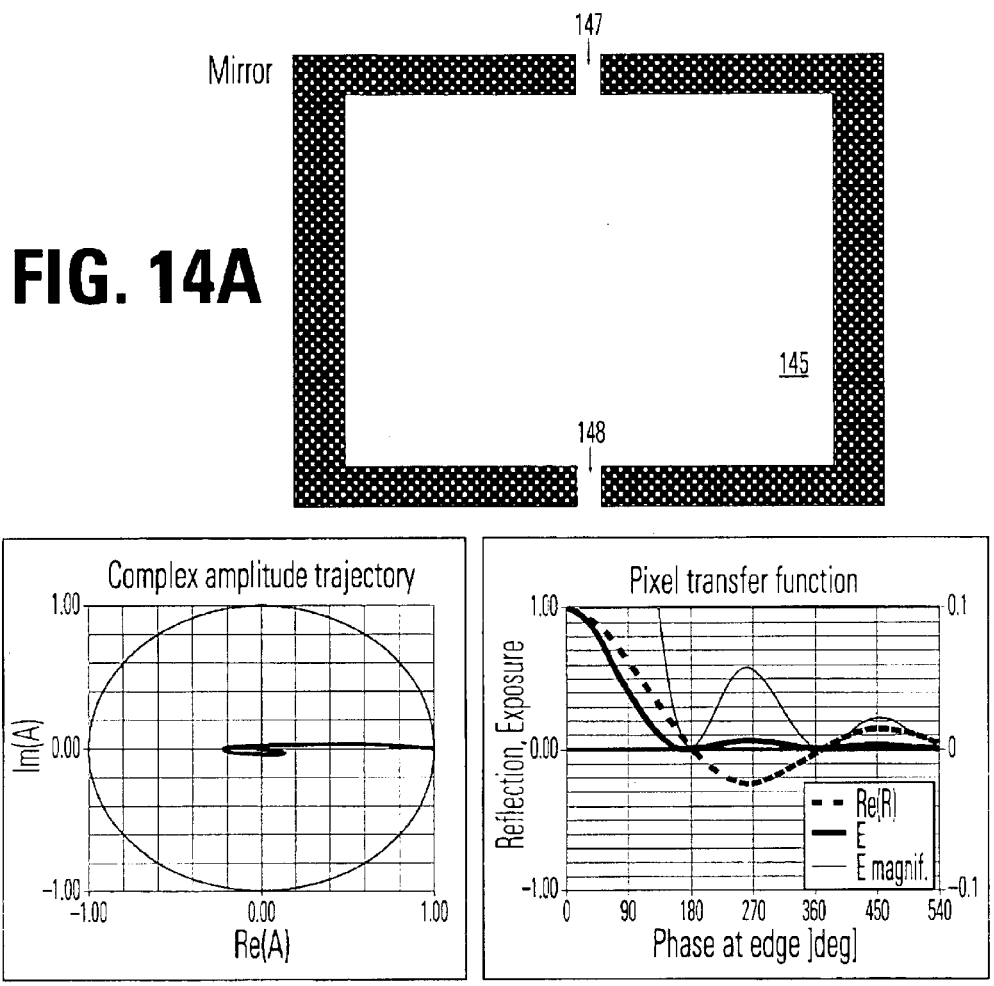
FIG. 14a depicts an embodiment of a mirror.

FIG. 14a illustrates a square shaped mirror 145 capable to be tilted at hinges 147, 148 defining a tilting axis. FIG. 14b illustrates the complex trajectory for said square shaped mirror. As can be seen from FIG. 14b an imaginary part of the complex amplitude is almost zero-indicating that the mirror element is nearly symmetrical. Symmetrical mirror elements have the imaginary part equal to zero.

FIG. 14c illustrates the reflection and exposure as functions of a phase of the mirror element at an edge of the same. The reflection is the real part of the complex amplitude reflectivity. The exposure is the square of the real part of the complex amplitude reflectivity. In the same FIG. 14c a magnified portion of the exposure is illustrated. A square mirror has a relatively low level of negative real part of the complex amplitude, therefore full phase shifting cannot be obtained.

Figure 15A:
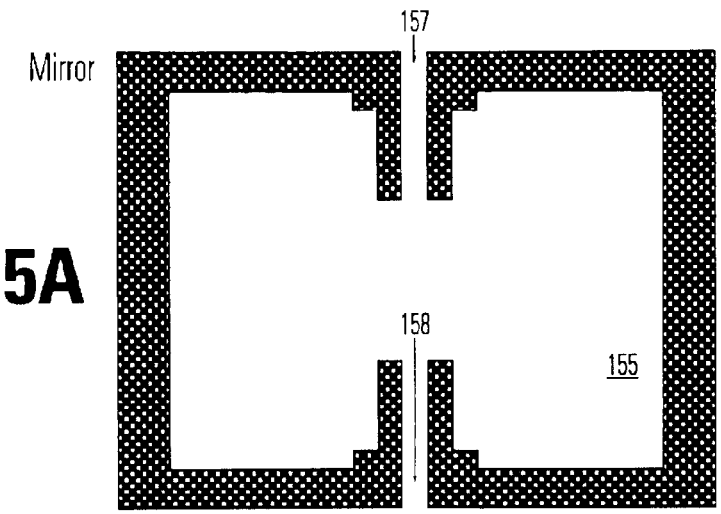
FIG. 15a depicts an embodiment of a mirror.
Figure 15B:
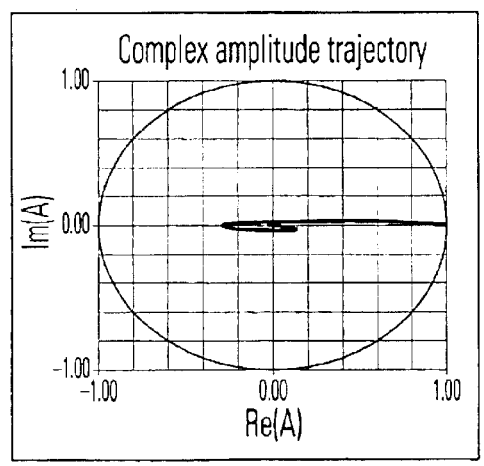
Figure 15C:
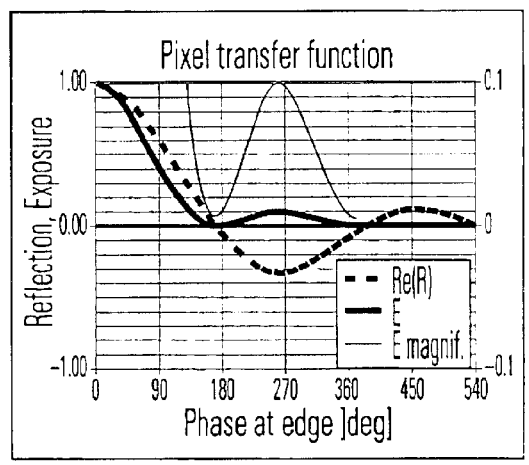

FIG. 15a illustrates another configuration of a mirror. In this embodiment the hinges 157, 158 are attached to the mirror 155 closer to the center compared to the mirror in FIG. 14a. This embodiment has less reflecting area compared to the mirror illustrated in FIG. 14a, especially it has less reflecting area close to the tilting axis defined by the hinges 157, 158. This will affect the minimum value of the complex amplitude as illustrated in FIGS. 15b and 15c, in that the real part has a minimum, which is more negative than the embodiment illustrated in FIG. 14a.

Figure 16A:
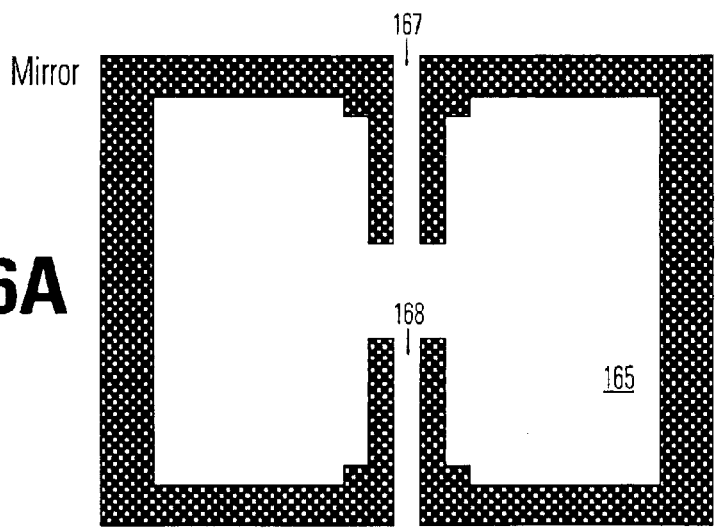
FIG. 16a depicts an embodiment of a mirror.
Figure 16B:
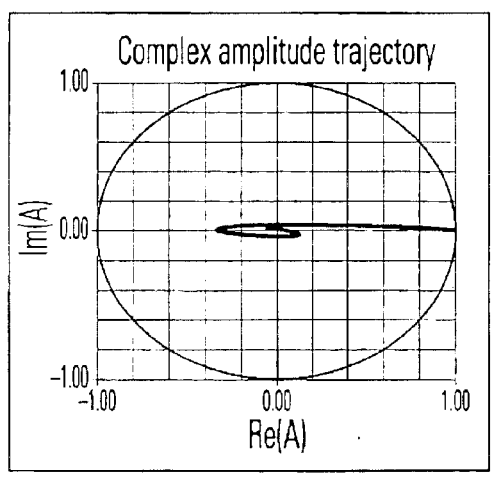
Figure 16C:
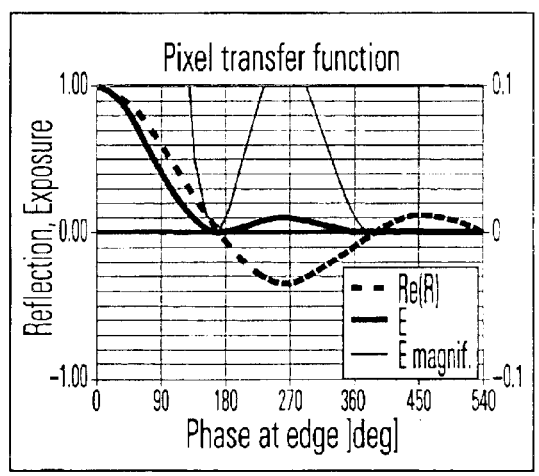

FIG. 16a illustrates another configuration of a mirror. In this embodiment the hinges 167, 168 are attached to the mirror 165 even closer to the center compared to FIG. 14a and FIG. 15a. This embodiment has less reflecting area compared to the mirror illustrated in FIGS. 14a and 15a, especially it has less reflecting area close to the tilting axis defined by the hinges 167, 168. This will affect the minimum value of the complex amplitude as illustrated in FIGS. 16b and 16c, in that the real part has a minimum, which is more negative than the embodiment illustrated in FIG. 14a and FIG. 15a.

Figure 17A:
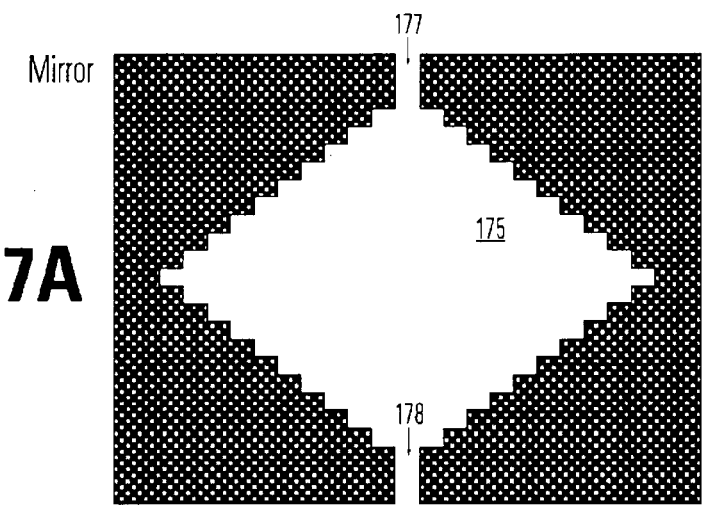
FIG. 17a depicts an embodiment of a mirror.
Figure 17B:
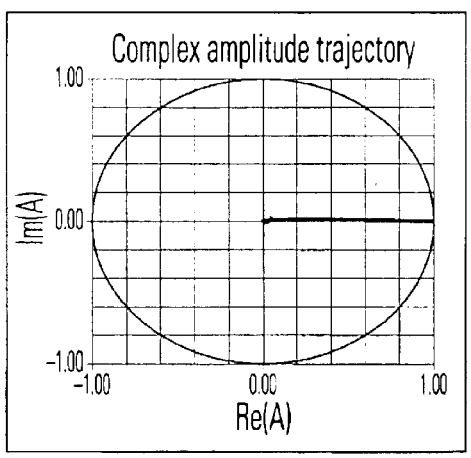
Figure 17C:
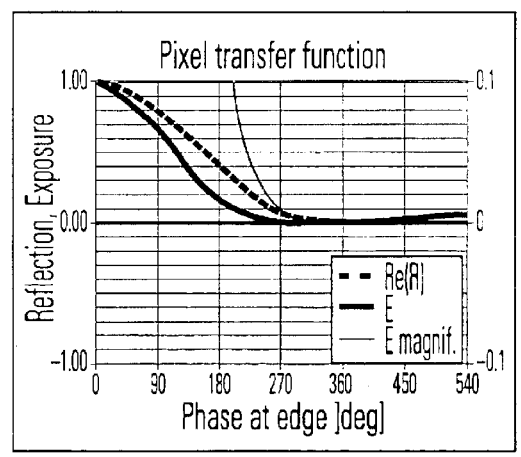

FIG. 17a illustrates yet another configuration of a mirror. In this embodiment the hinges 177, 178 are attached to two diagonally displaced corners of the mirror 175. The illustrated embodiment has no negative complex amplitude, neither real nor imaginary.

FIG. 18a illustrates still another configuration of a mirror 185. To said mirror 185 are attached two hinges 187, 188, defining a tilting axis. This configuration has two sides, which are zigzag-formed, where one is the inverse of the other. This configuration, as well as the previously illustrated ones, is perfectly suitable to be stitched together in a one- or two-dimensional array of micromirrors, such as in a spatial light modulator. The complex amplitude trajectory is illustrated in FIG. 18b, which indicates that this embodiment has a slightly negative complex amplitude. FIG. 18c illustrates the exposure and reflection for the configuration in FIG. 18a.

Figure 19B:
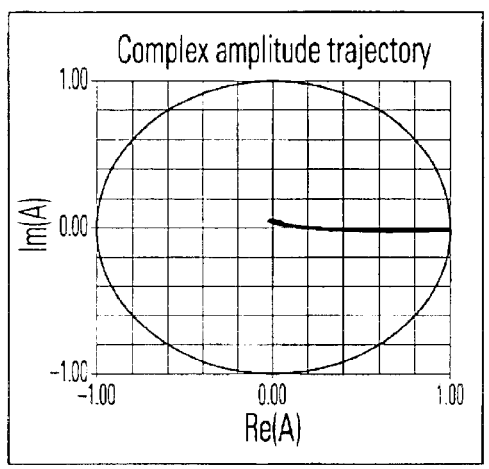
Figure 19C:
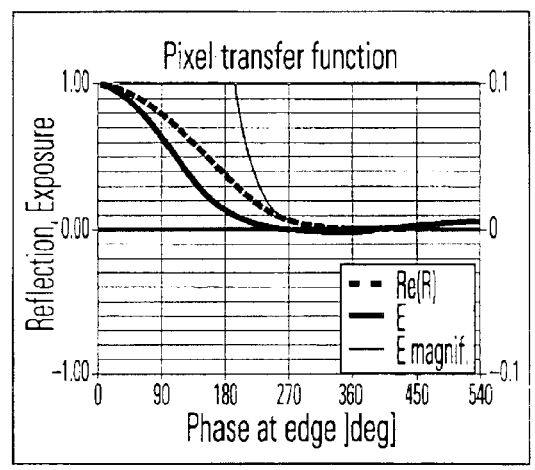

FIG. 19a illustrates still another configuration of a mirror 195. To said mirror 195 are attached two hinges 197, 198, defining a tilting axis. This embodiment has also two sides where one is the inverse of the other one. This configuration is suitable to be stitched together in the one or two dimensional array of mirrors. As can be seen in FIGS. 19b and 19c this embodiment has less negative complex amplitude compared to the configuration illustrated in FIG. 18a.

Figure 20A:
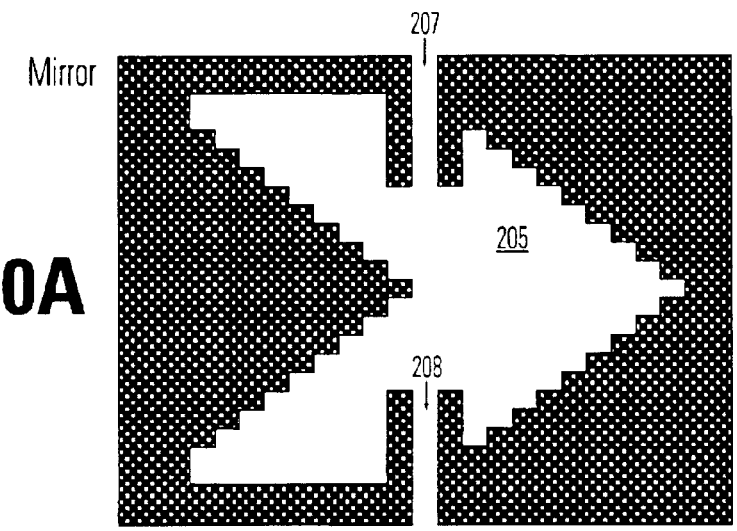
FIG. 20a depicts an embodiment of a mirror.
Figure 20B:
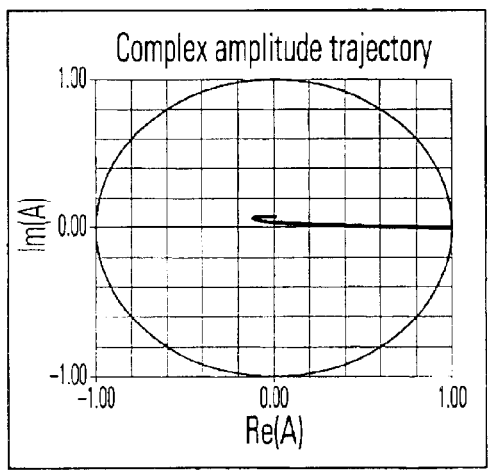
Figure 20C:
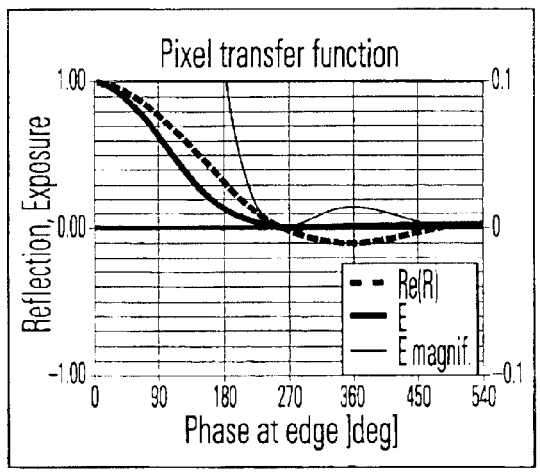

FIG. 20a illustrates still another configuration of a mirror 205. This embodiment differs to the one illustrated in FIG. 19a in that a reflecting area is slightly less than the embodiment illustrated in FIG. 19a. Areas are cut off around an attachment position of hinges 207, 208, which is not the case in FIG. 19a. As can be seen in FIGS. 20b, 20c, this embodiment has slightly more negative complex amplitude than the configuration in FIG. 19a.

Figure 21A:
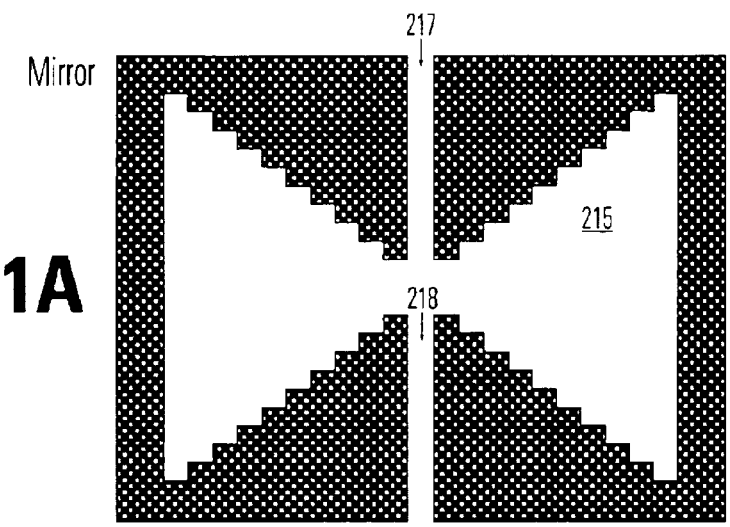
FIG. 21a depicts an embodiment of a mirror.
Figure 21B:
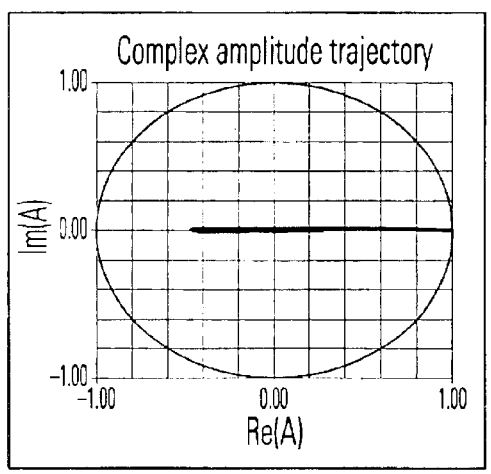
Figure 21C:
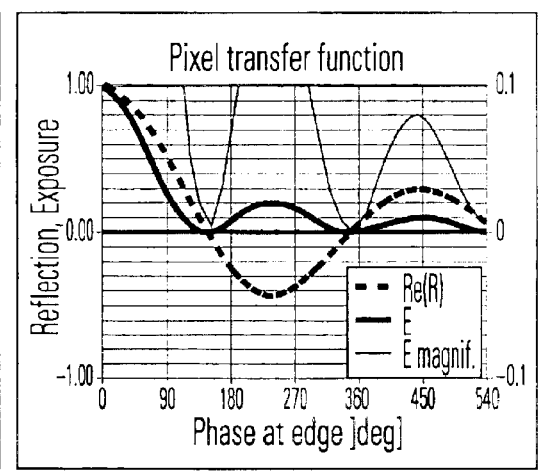

FIG. 21a illustrates still another mirror configuration. In this configuration hinges 217, 218 define a tilting axis. Here the mirror area is much less close to the tilting axis compared to further away, which will affect the complex amplitude of the mirror, see FIGS. 21b and 21c. As the mirror element is almost symmetrical there is no imaginary part of the complex amplitude present. The real part of the complex amplitude is more negative than all previously illustrated embodiments above.

Figure 22A:
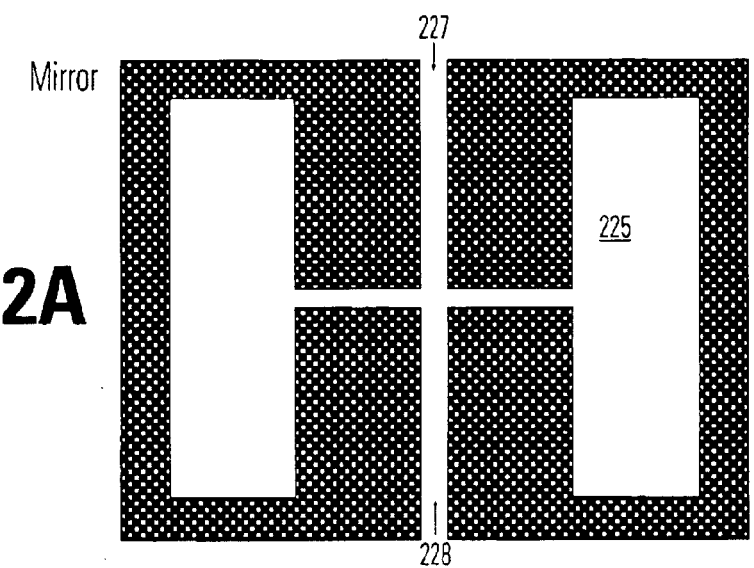
FIG. 22a depicts an embodiment of a mirror.
Figure 22B:
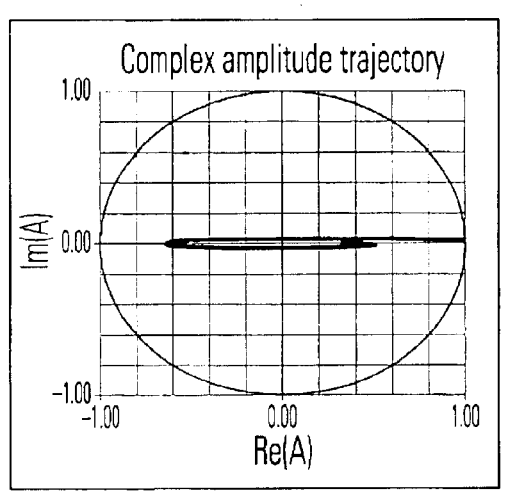
Figure 22C:
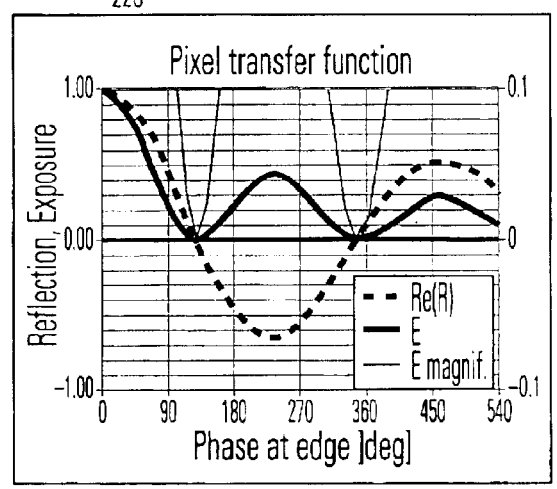
Figure 22D:
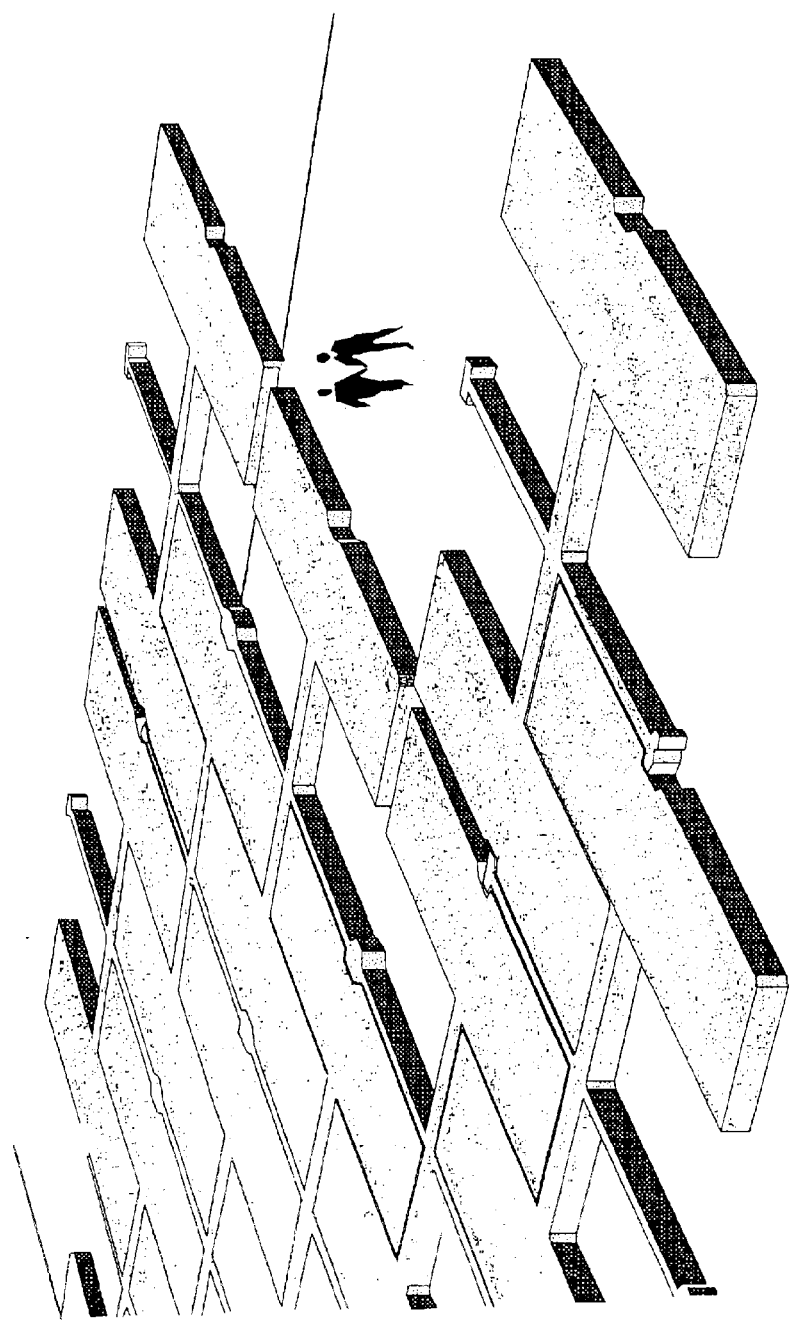

FIG. 22a illustrates still another mirror configuration. Hinges 227 and 228 define a tilting axis as previous. In this embodiment there is almost no reflecting area close to the tilting axis. Nearly all reflecting areas are at a distance from the tilting axis. This will increase the negative complex amplitude even more compared to the embodiment illustrated in FIG. 21a. This configuration is also suitable to be arranged in a one or two-dimensional array of mirror elements. This is illustrated in FIG. 22d.

Figures 23A, 23B, 23C:
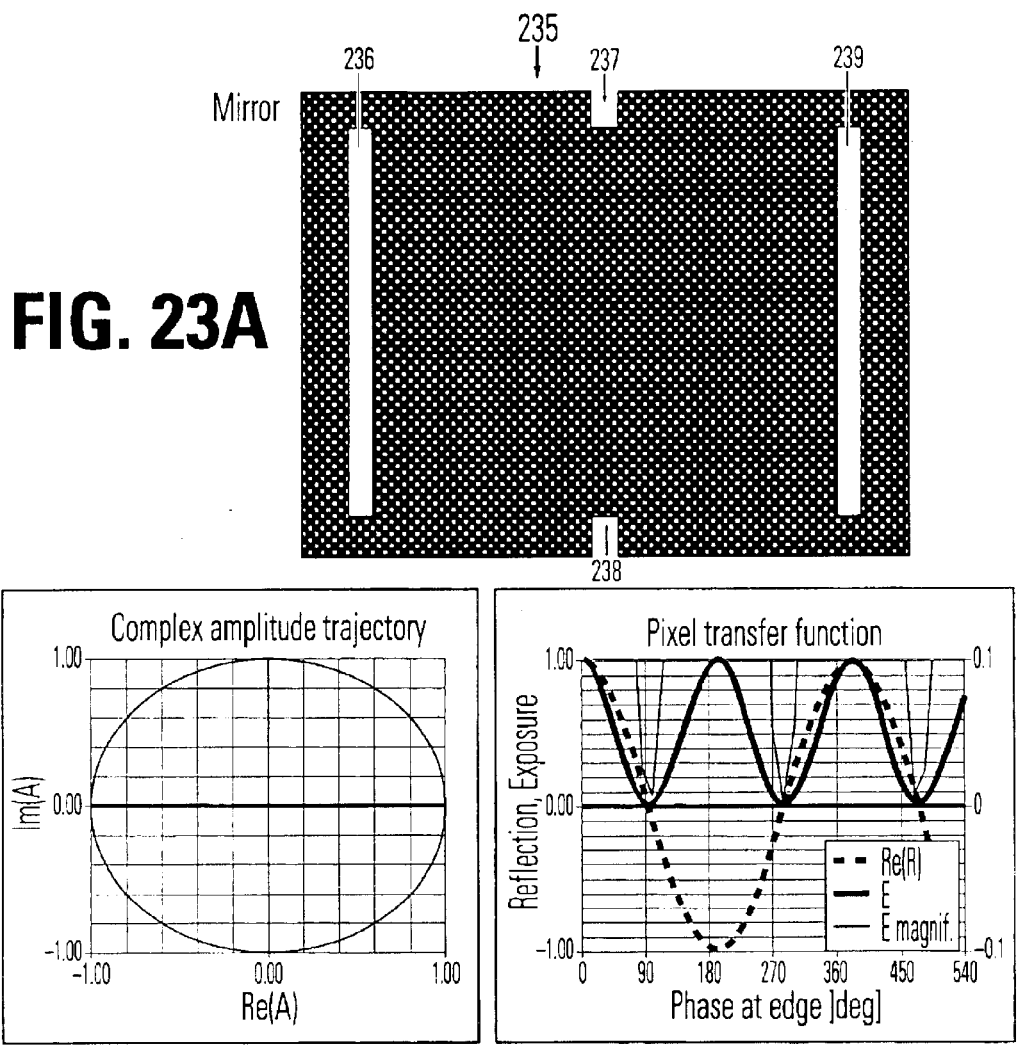

FIG. 23 illustrates still another mirror configuration 235. Hinges are attached to support structures 237, 238. The hinge are may be covered with an anti-reflective coating in order not to reflect any radiation at a predetermined wavelength, said hinges are hidden for said reason n FIG. 23a. Also hidden is a connecting element connecting reflecting areas 236, 239. This configuration exhibit exceptional complex amplitude values as indicated in FIG. 23b and FIG. 23c. The real part of the complex amplitude goes from +1 to −1 and there is no imaginary part of the complex amplitude.

FIG. 25a illustrates still another embodiment of a mirror configuration 255. This embodiment differs to the one illustrated in FIG. 15a in that some corner areas 251, 252, 253, 254 of the mirror are out of phase relative the rest of the mirror. Preferably said corner areas affect a reflected wavelength so that said reflected wavelength from said corner areas are 180 degrees out of phase relative to the other mirror areas. As illustrated in FIGS. 25b, 25c, the complex amplitude will decrease compared to the embodiment in FIG. 15a.

Figure 26A:
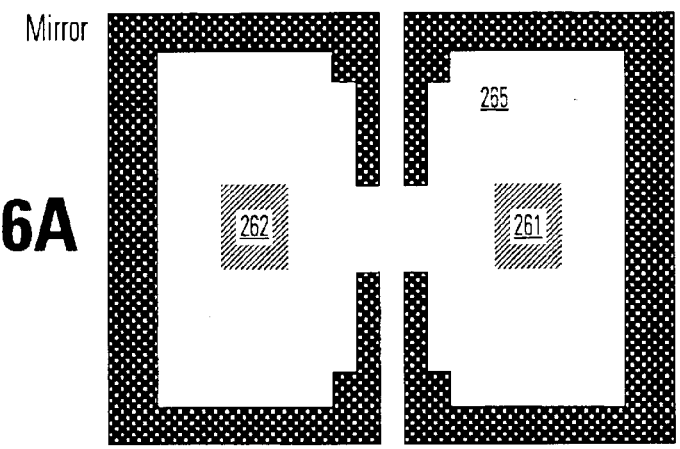
FIG. 26a depicts an embodiment of a mirror.
Figure 26B:
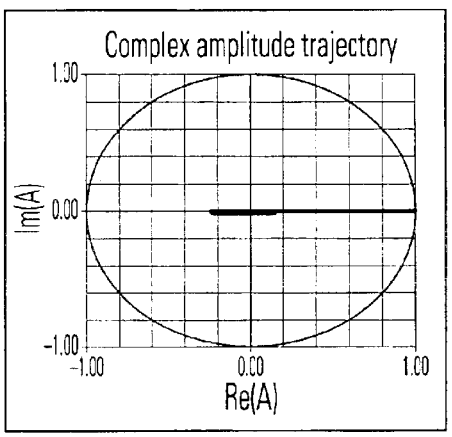
Figure 26C:
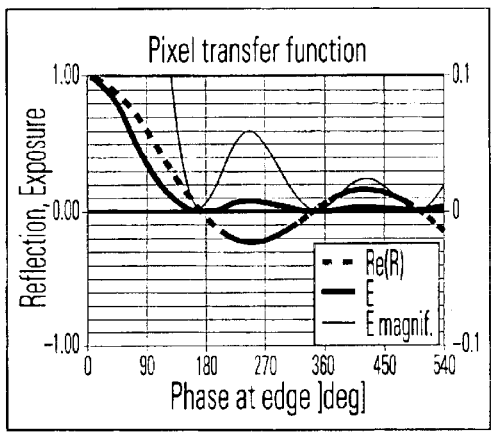

FIG. 26a illustrates still another mirror configuration 265. In this configuration there are two areas 261, 262 which are out of phase relative to the rest of the mirror. Preferably said areas affect a reflected wavelength so that said reflected wavelength from said areas are 180 degrees out of phase relative to the other mirror areas. This embodiment will affect the complex amplitude, see FIGS. 26b, 26c, slightly different compared to the embodiment illustrated in FIG. 25a.

Figure 27A:
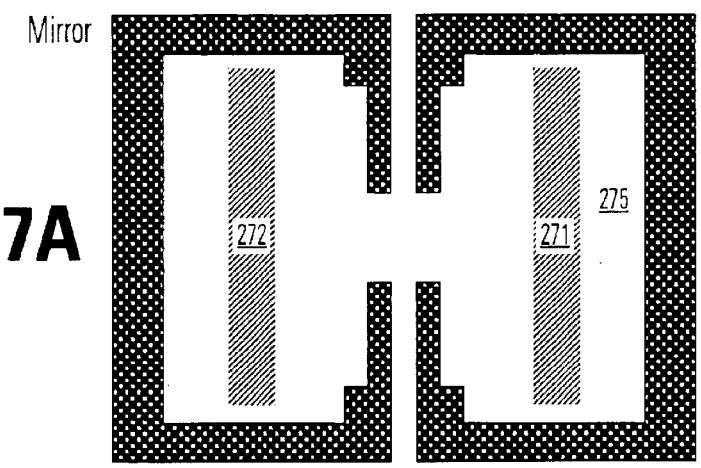
FIG. 27a depicts an embodiment of a mirror.
Figure 27B:
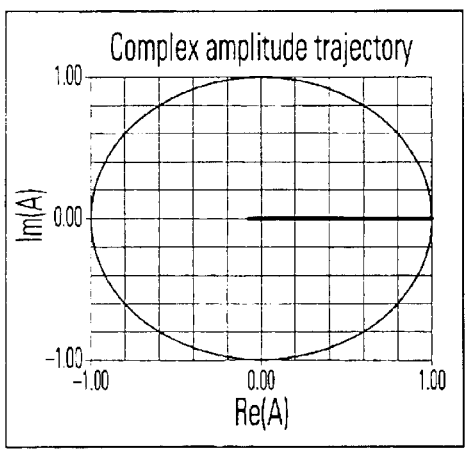
Figure 27C:
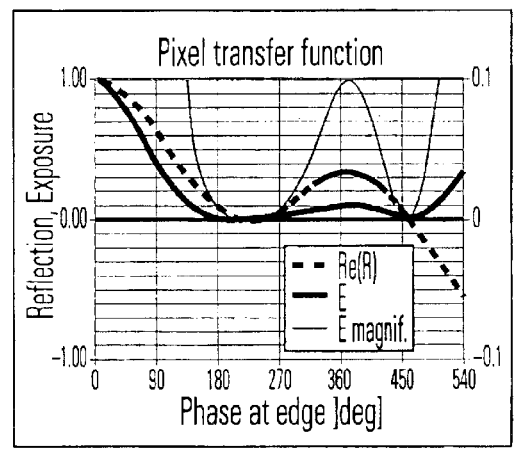

FIG. 27a illustrates yet another embodiment of a mirror configuration 275. Here are out of phase areas 271, 272 larger than the out of phase areas in FIG. 26a. This will affect the position of the local maximum and minimum positions of the reflection, see FIG. 27c compared with FIG. 26c, as well as this embodiment give a more negative complex amplitude than the embodiment in FIG. 26a.

Figure 28A:
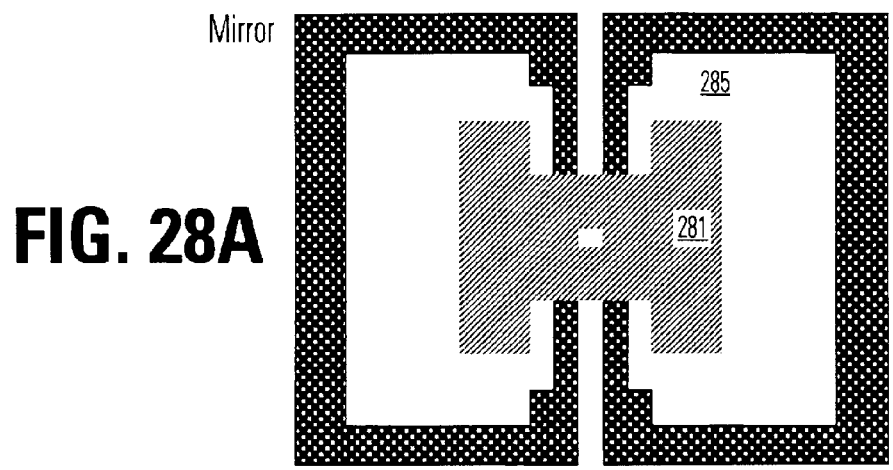
FIG. 28a depicts an embodiment of a mirror.
Figure 28B:
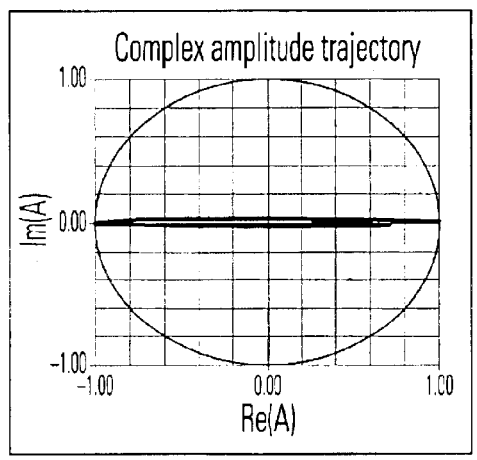
Figure 28C:
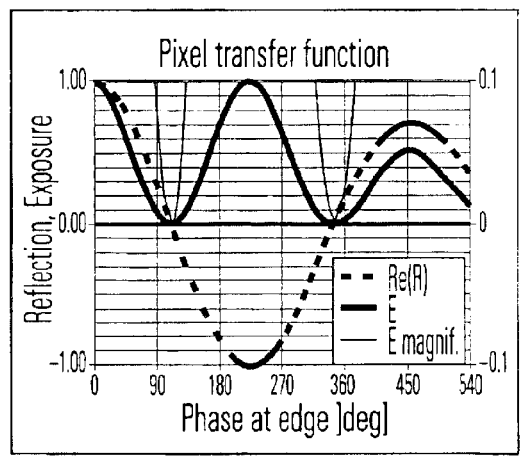

FIG. 28a illustrates still another mirror configuration 285. Here the central part of the mirror is covered with an area 281, which area is 180 degrees out of phase relative the rest of the mirror. This embodiment will cause the complex amplitude to go from +1 to −1, see FIGS 28b, 28c.

Figure 29A:
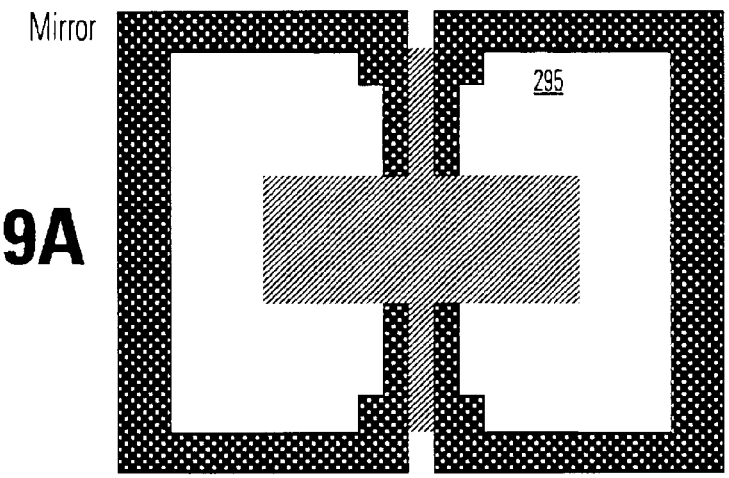
FIG. 29a depicts an embodiment of a mirror.
Figure 29B:
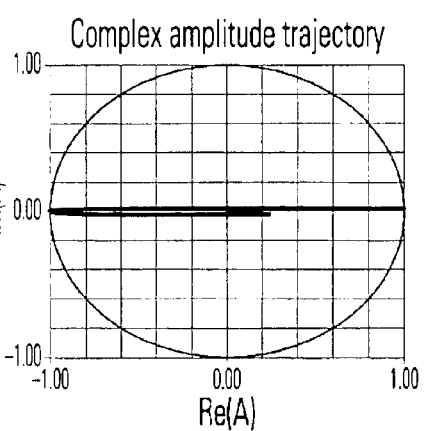
Figure 29C:
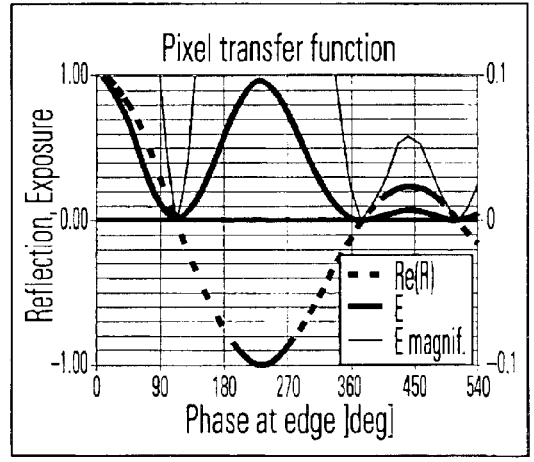

FIG. 29a illustrates still another mirror configuration 295. Here the central part of the mirror 295 is covered with an area 180 degrees out of phase relative the rest of the mirror. The area is slightly differently shaped compared to the one in FIG. 28a, resulting in slightly different complex amplitude values, see FIGS. 29a, 29b.

FIG. 30a illustrates still another mirror configuration 305 having a central part covered with an area 180 degrees out of phase relative to the rest of the mirror.

In the embodiments illustrated in FIGS. 25a–30a the area 180 degrees out of phase relative to the other part of the mirror apply to reflected light/electromagnetic radiation.

Figure 31A:
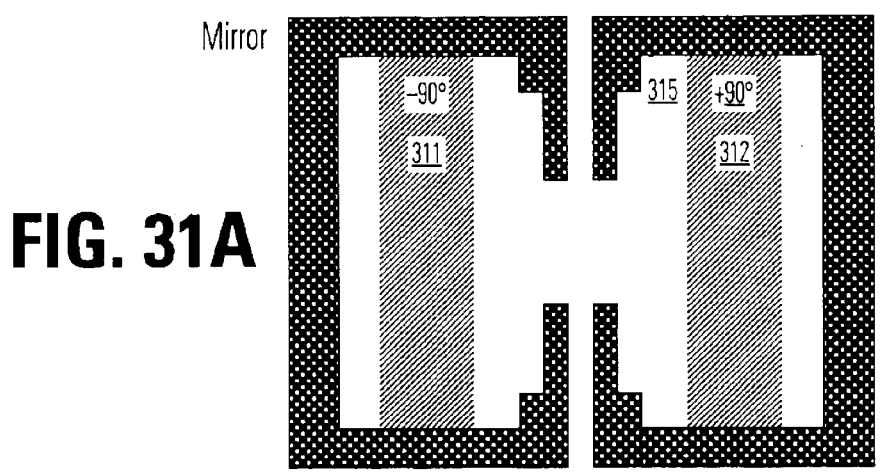
FIG. 31a depicts an embodiment of a mirror.
Figure 31B:
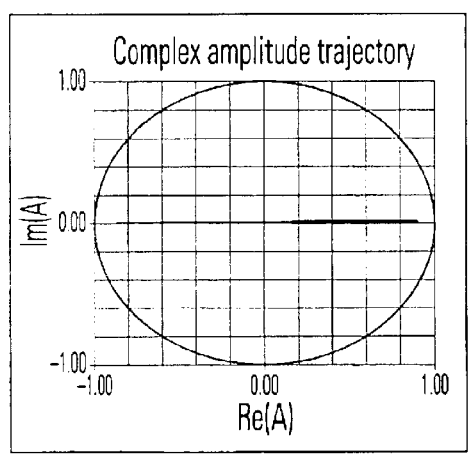
Figure 31C:
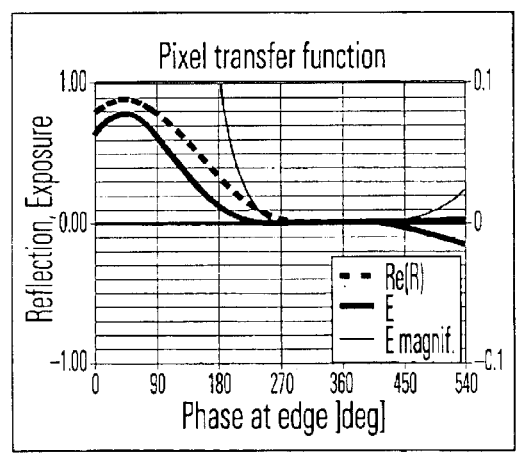

FIG. 31a illustrates still another mirror configuration 315. Here there are two areas, which are out of phase for reflected light/electromagnetic radiation relative the rest of the mirror. A first area 311 is −90 degrees out of phase relative to the nonhatched mirror areas. A second area 312 is +90 degrees out of phase relative the non hatched parts of the mirror. This embodiment will give an extended deflection range giving 0 reflection, see FIG. 31c. As can be seen from FIG. 31b this mirror configuration has no imaginary part.

FIG. 31a has areas (hatched in figure) with different heights than lambda over four. Such structures can be used to further modify the pixel characteristics. The example in FIG. 31a gives an R maximum at a small tilt and a plateau at R=0. This mirror is easier to calibrate accurately than the other mirrors shown.

There are at least three interesting cases of ranges of complex amplitude reflectivity cases. The first one relates to full phase shifting capability, which means that the complex amplitude reflectivity goes from +1 to −1, a plurality of mirror configurations having such characteristic has been disclosed above.

The second one relates to attenuated phase shift masks, which means that the complex amplitude goes from +1 to −0,245.

The third one relates to an ordinary chrome mask, which means that the complex amplitude goes from +1 to 0.

A suitable mirror design gives a relative flat graph for the complex amplitude as a function of mirror tilt angle or reflected light at he edge of the mirror. Such mirror design will not be so sensitive to changes in tilt angle for the desired gray-value of the mirror element.

When the complex amplitude is specified in the range −1 to 1 it implies that the amplitude is normalized, so that the highest amplitude that is used is normalized to +1.00. The same holds for complex amplitude reflection. Exceptions to this normalization are where it is obvious from the context that an actual value or a value normalized to an ideal specular reflecting surface is used.

These values are the same as those used in Levinson-type PSM, chrome-less phase lithography (CPL), and other so called strong PSMs. By driving the SLM to these values the same resolution and process latitude gains can be made as in wafer lithography using strong PSMs. Figure XX shows haw the Re(A) can be controlled to act as a number of commonly used types of phase-shifting masks.

The H shape is also surface filling, but gives a pattern that is not optimal for rasterizing. An equivalent mirror shape can be created from a square mirror place by reduction of the mirror reflectivity on some areas. The reflectivity can be reduced by coatings of a low-reflectance material or by structuring the surface to create destructive interference or light scattering away from the projection optics. The illumination with the small angular spread used makes it possible to use rather large surface structures.

In the description above negative values of R have been used for edge enhancement and correction of grid and x-y artifacts. It is also possible to use the SLM as a strong phase-shifting mask (PSMs) as known in lithography. The pixels in 7d and 8a–c can produce R values of 1.00, 0.00, and −1.00 (after scaling by an increase of dose). These values are the same as those used in Levinson-type PSM, chrome-less phase lithography (CPL), and other so called strong PSMs. By driving the SLM to these values the same resolution and process latitude gains can be made as in wafer lithography using strong PSMs.

In addition the SLM also has intermediate values not present in commonly used masks. These are used for placement of edges in a fine address grid. They can also be used for phase-shifting lithography equivalent to "high transmission PSMs" and "tri-tone masks" known in the art e.g. for printing of dense contacts.

If there is a small asymmetry between R=1.00 and −1.00 it gives every-second-line artifacts in the printed pattern. A remedy is shown in FIG. 11b. The pixels form a checkerboard pattern where every second mirror is displaced by 180 degrees, i.e. they move from −180 to +180 degrees instead of the normal +180 to −180.

A strongly phase-shifting reticle normally have areas with three complex amplitudes A=+1.00, 0.00, and −1.00. Although they can be described with a single parameter they are usually defined in two binary (having areas of two kinds) mask data files: one file for dark and one file for those areas that are shifted, i.e. 180 degree phase. The shifter features are usually printed with an overlap of the chrome so that the chrome data determines the dimension in the mask.

An embodiment of an SLM printer using phase-shifting SLMs follows the scheme above. It rasterizes two binary (two valued) input files and combines them in a Boolean operation to create the multi valued SLM bitmap data. Each binary set of data can have its own set of bitmap operations, such as CD bias and edge enhancement. This preserves the highest degree of transparency between mask and maskless pattern data files.

In another embodiment the rasterizer reads a file containing at least two types of areas and a background, e.g. clear and shifted areas in a dark background and rasterizes them directly to a multivalued bitmap. This has the advantage of creating immediately interpolated edges for all types of feature boundaries: clear to dark, shifted to dark, and clear to shifted. It is also more suitable for working directly from the design database without the intermediate step of mask data tape-out. The relative benefits of the first and second type of rasterization depend on the application and a preferred embodiment can use either scheme.

While the present invention is disclosed by reference to the preferred embodiments and examples detailed above, it is understood that these examples arm intended in an illustrative rather than in a limiting sense. It is contemplated that modifications and combinations will readily occur to those skilled in the art, which modifications and combinations will be within the spirit of the invention and the scope of the following claims.

I claim:

1. A method for printing fine patterns with high precision, comprising the actions of:
   providing an SLM having an array of modulator elements,
   providing an electromagnetic radiation source to illuminate said SLM with partially coherent illumination with a coherence length that is larger than half the pitch of the modulating elements in the SLM,
   creating a negative complex amplitude with at least one modulator element.

2. The method according to claim 1, wherein said radiation source is a pulsed laser source.

3. The method according to claim 1, wherein said electromagnetic radiation source having a wavelength in the region of UV, EUV, DUV, VUV.

4. The method according to claim 1, wherein said modulator elements are operated an analog mode.

5. The method according to claim 1, wherein said SLM is a reflective SLM.

6. The method according to claim 1, wherein said negative complex amplitude is more negative than −0.218.

7. The method according to claim 1, wherein said negative complex amplitude is more negative than −0.5.

8. A method for printing fine patterns, comprising the actions of:
   providing an SLM,
   providing a data path including a rasterizer,
   rasterizing an input pattern to a grayscale bitmap,
   providing an edge-sharpening filter operating on the bitmap.

9. The method according to claim 8, wherein said SLM is operated in an analog mode.

10. The method according to claim 8, wherein said pattern is printed using a multipass writing strategy.

11. The method according to claim 8, wherein said edge sharpening filter is a convolution filter.

12. The method according to claim 8, wherein said edge sharpening filter is a rule based filter.

13. A method for printing fine patterns comprising the actions of
    providing an SLM and a partially coherent optical system,
    providing a data path including a rasterizer,
    rasterizing an input pattern to a grayscale bitmap,
    providing an edge-sharpening filter operating on the bitmap,
    wherein said edge-sharpening filter producing pixels with negative complex amplitude.

14. The method according to claim 13, wherein said SLM is operated in an analog mode.

15. The method according to claim 13, wherein said pattern is printed using multipass writing strategy.

16. The method according to claim 13, wherein said edge sharpening filter is a convolution filter.

17. The method according to claim 13, wherein said edge sharpening filter is a rule based filter.

18. A method for printing fine pattern comprising the actions of:
    providing an SLM,
    providing a partially coherent optical system,
    providing pixels with less reflection close to the axis.

19. The method according to claim 18, wherein said pixels have less reflecting area close to the axis than further away.

20. The method according to claim 18, wherein said pixels are essentially rectangular and provided with anti-reflective coating close to the axis.

21. The method according to claim 18, wherein said pixels are essentially rectangular and provided with radiation scattering elements close to the axis.

22. A method for printing fine pattern comprising the actions of:
    providing an SLM with an array of reflecting elements,
    providing a surface profile for at least one reflecting element,
    said surface profile having area elements with at least two heights.

23. The method according to claim 22, wherein said area elements are 180 apart for a wavelength chosen to print said pattern.

24. A method for printing fine patterns comprising the actions of:
    providing an SLM,
    providing a bitmap representing the input data,
    separating said bitmap into two bitmaps,
    filtering the two bitmaps using different filters,
    combining the two bitmaps to expose the image.

25. The method according to claim 23, wherein said bitmaps are combined into a single writing pass.

26. The method according to claim 23, wherein said bitmaps are combined into a plurality of writing passes.

27. The method according to claim 23, wherein at least one filter is a low-pass characteristics.

28. The method according to claim 23, wherein at least one filter is a high-pass characteristics.

29. The method according to claim 23, wherein said filters act differently in an X direction of the pattern and an Y direction of the pattern.

30. The method according to claim 23, wherein in a multipass writing strategy the optical settings are different for the different filters.

31. The method according to claim 27, wherein in a multipass writing strategy the optical settings are different for the different filters.

32. The method according to claim 28, wherein in a multipass writing strategy the optical settings are different for the different filters.

33. A method for printing fine patterns comprising the actions of:
    detecting edges in the bitmap,
    characterizing the steepness of the transition of the edges,
    making digital edge enhancements based on said steepness.

34. The method according to claim 33, wherein said input data is having at least two-valued layers.

35. The method according to claim 33, wherein said input data having features with different complex amplitudes.

36. The method according to claim 33, further comprising the action of:
    rasterizing said features to multiple bitmaps and combining said bitmaps to drive the SLM.

37. A method for printing fine patterns comprising the actions of:
    providing an SLM having analog function with a range from positive to negative complex amplitude reflection,
    providing a data path,
    providing input data describing a pattern having extended areas with at least three complex amplitude values and edges between them, converting said data input to a bitmap of pixel values that correspond to both negative and positive complex amplitude.

38. The method according to claim 37, further comprising the action of:

rasterizing each two-valued layer bitmap and combining said bitmaps to drive the SLM.

39. A method for printing fine patterns comprising the actions of:

providing an SLM, providing a pixel layout pattern with different categories of modulating elements, the categories differing in the phase of the complex amplitude.

40. The method according to claim 39, wherein said categories are two categories, a first with phase 0 and a second with a 180 degrees phase.

41. The method according to claim 39, wherein said categories are three categories, a first with a phase 0, a second with a phase 120, and a third with a phase 240 degrees.

42. The method according to claim 39, wherein said categories are four categories a first with phase 0, a second with phase 90, a third with phase 180, and a fourth with phase 270 degrees.

* * * * *